(12) United States Patent
Hirakata et al.

(10) Patent No.: US 9,583,739 B2
(45) Date of Patent: Feb. 28, 2017

(54) LIGHT-EMITTING DEVICE HAVING AN ELECTRODE WITH DEPRESSIONS

(71) Applicant: Semiconductor Energy Laboratory Co., Ltd., Kanagawa-ken (JP)

(72) Inventors: Yoshiharu Hirakata, Kanagawa (JP); Mika Jikumaru, Kanagawa (JP); Yusuke Kubota, Kanagawa (JP); Daisuke Kubota, Kanagawa (JP); Tetsuji Ishitani, Kanagawa (JP); Hideaki Shishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/252,033

(22) Filed: Apr. 14, 2014

(65) Prior Publication Data
US 2014/0306241 A1    Oct. 16, 2014

(30) Foreign Application Priority Data

Apr. 15, 2013  (JP) ................. 2013-084443

(51) Int. Cl.
*H01L 33/38*  (2010.01)
*H01L 51/52*  (2006.01)
*H01L 27/32*  (2006.01)

(52) U.S. Cl.
CPC ...... *H01L 51/5281* (2013.01); *H01L 51/5209* (2013.01); *H01L 51/5218* (2013.01); *H01L 27/322* (2013.01); *H01L 27/3258* (2013.01); *H01L 33/38* (2013.01); *H01L 51/525* (2013.01); *H01L 2924/0002* (2013.01)

(58) Field of Classification Search
CPC . H01L 33/38; H01L 51/5281; H01L 51/5209; H01L 51/5218
See application file for complete search history.

(56) References Cited

U.S. PATENT DOCUMENTS

| | | | | |
|---|---|---|---|---|
| 4,103,297 | A | * | 7/1978 | McGreivy et al. ............. 345/90 |
| 4,599,482 | A | * | 7/1986 | Yamazaki ..................... 136/259 |
| 5,193,017 | A | * | 3/1993 | Iwai et al. ..................... 349/43 |

(Continued)

FOREIGN PATENT DOCUMENTS

| | | |
|---|---|---|
| JP | 2000-040584 A | 2/2000 |
| JP | 2003-243152 A | 8/2003 |

(Continued)

*Primary Examiner* — Ida M Soward
(74) *Attorney, Agent, or Firm* — Husch Blackwell LLP

(57) ABSTRACT

In a light-emitting device where reflective electrodes are regularly arranged, occurrence of interference fringes due to reflection of light reflected by the reflective electrode is inhibited. A surface of the reflective electrode of a light-emitting element is provided with a plurality of depressions. The shapes of the plurality of depressions are different from each other and do not have rotational symmetry. Irregularity of the surface shape of the reflective electrode is increased, which inhibits interference of light reflected by the reflective electrode. To form the plurality of depressions in the surface of the reflective electrode, for example, a surface of an insulating layer that is a base of the reflective electrode is made uneven. Reflecting the surface shape of the insulating layer, the reflective electrode has an uneven surface.

21 Claims, 11 Drawing Sheets

(56) References Cited

U.S. PATENT DOCUMENTS

| | | | |
|---|---|---|---|
| 6,181,398 B1* | 1/2001 | Libsch et al. ................. 349/113 |
| 6,387,737 B1 | 5/2002 | Yamazaki et al. |
| 6,433,487 B1* | 8/2002 | Yamazaki ........... H01L 27/3281 |
| | | | 136/261 |
| 6,709,901 B1 | 3/2004 | Yamazaki et al. |
| 6,855,957 B1 | 2/2005 | Yamazaki et al. |
| 6,900,084 B1 | 5/2005 | Yamazaki |
| 7,223,146 B2* | 5/2007 | Nishikawa ......... H01L 27/3258 |
| | | | 445/23 |
| 7,435,630 B2* | 10/2008 | Lee ........................ H01L 27/12 |
| | | | 257/E27.111 |
| 7,732,824 B2 | 6/2010 | Konuma et al. |
| 7,753,751 B2 | 7/2010 | Yamazaki |
| 7,772,765 B2* | 8/2010 | Park .................... H01L 27/3232 |
| | | | 313/506 |
| 7,903,055 B2* | 3/2011 | Nishikawa ......... H01L 51/5209 |
| | | | 257/40 |
| 7,906,898 B2* | 3/2011 | Lee ............................... 313/504 |
| 8,098,008 B2* | 1/2012 | Kim .................... H01L 51/5228 |
| | | | 313/504 |
| 8,242,692 B2* | 8/2012 | Kim .................... H01L 51/5281 |
| | | | 257/40 |
| 8,368,617 B2* | 2/2013 | Asaki ................. H01L 51/5209 |
| | | | 313/506 |
| 8,605,240 B2* | 12/2013 | Aihara .............. G02F 1/133553 |
| | | | 349/113 |
| 8,659,025 B2* | 2/2014 | Fujimoto et al. ................ 257/72 |
| 8,665,403 B2 | 3/2014 | Yamazaki et al. |
| 8,680,513 B2* | 3/2014 | Jung .................... H01L 27/3246 |
| | | | 257/40 |
| 9,029,838 B2* | 5/2015 | Lim .................... H01L 51/5209 |
| | | | 257/40 |
| 9,040,323 B2* | 5/2015 | Hong ..................... G02B 26/02 |
| | | | 257/40 |
| 9,054,053 B2* | 6/2015 | Sagawa ............... H01L 27/3258 |
| | | | 313/505 |
| 2002/0140886 A1 | 10/2002 | Sugiura et al. |
| 2003/0007113 A1 | 1/2003 | Yamanaka et al. |
| 2004/0000673 A1* | 1/2004 | Murakami ....................... 257/88 |
| 2004/0141113 A1* | 7/2004 | Yun .................... G02F 1/136227 |
| | | | 349/113 |
| 2006/0038944 A1* | 2/2006 | Kim et al. ...................... 349/114 |
| 2007/0013648 A1* | 1/2007 | Yamaguchi ........ G02F 1/133555 |
| | | | 345/102 |
| 2007/0096636 A1* | 5/2007 | Park .................... H01L 27/3246 |
| | | | 313/503 |
| 2008/0099664 A1* | 5/2008 | Yamazaki ........... H01L 27/1443 |
| | | | 250/214 A |
| 2009/0268454 A1* | 10/2009 | Tatehata et al. .............. 362/235 |
| 2010/0045576 A1* | 2/2010 | Park .................... H01L 51/5281 |
| | | | 345/76 |
| 2010/0052519 A1* | 3/2010 | Jeon .................... H01L 27/3246 |
| | | | 313/504 |
| 2010/0060148 A1* | 3/2010 | Hwang ............... H01L 27/3213 |
| | | | 313/504 |
| 2010/0156273 A1* | 6/2010 | Utsunomiya ....... H01L 27/3276 |
| | | | 313/498 |
| 2010/0176717 A1* | 7/2010 | Lee .................... H01L 51/5271 |
| | | | 313/504 |
| 2013/0001610 A1* | 1/2013 | Iwakura .............. H01L 27/3223 |
| | | | 257/91 |
| 2013/0032829 A1* | 2/2013 | Sung ........................ C23C 14/12 |
| | | | 257/88 |
| 2013/0161684 A1* | 6/2013 | Momma et al. .............. 257/100 |
| 2013/0240852 A1* | 9/2013 | Yamazaki ....................... 257/40 |
| 2015/0053959 A1* | 2/2015 | Yamazaki et al. .............. 257/40 |

FOREIGN PATENT DOCUMENTS

| | | |
|---|---|---|
| JP | 2012-008544 A | 1/2012 |
| KR | 707601 B1 * | 4/2007 |

* cited by examiner

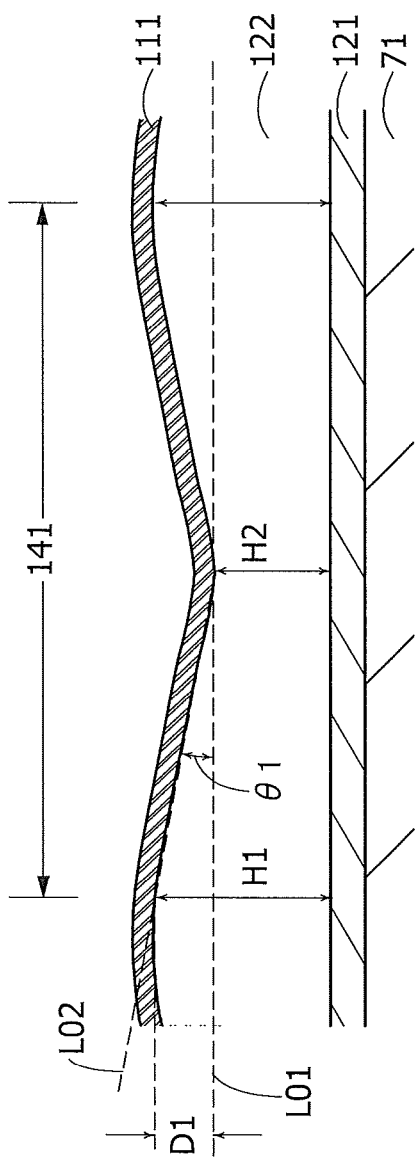
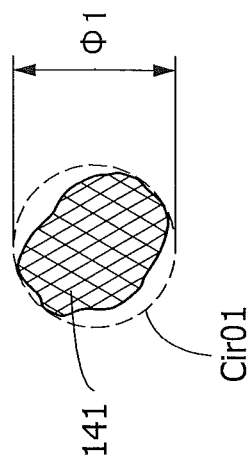
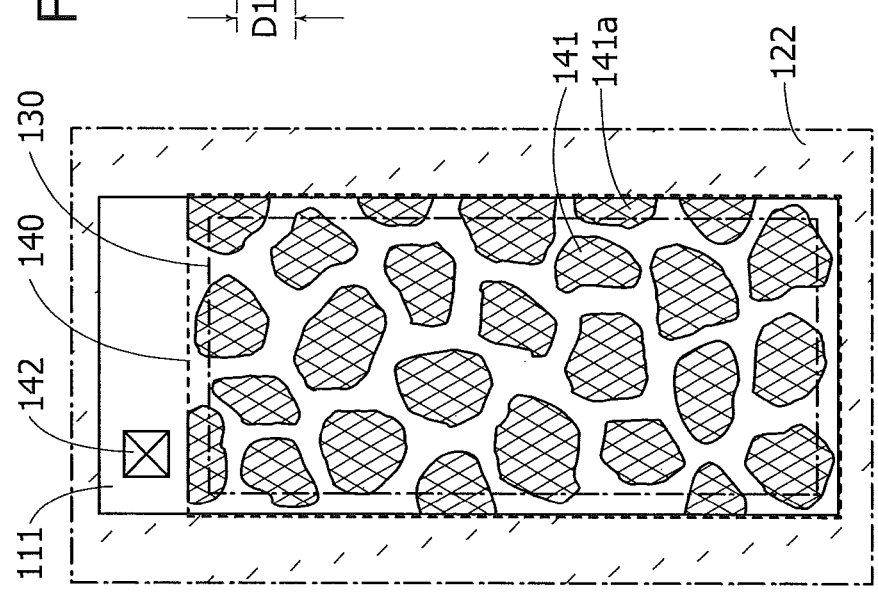
FIG. 2B
FIG. 2C
FIG. 2A

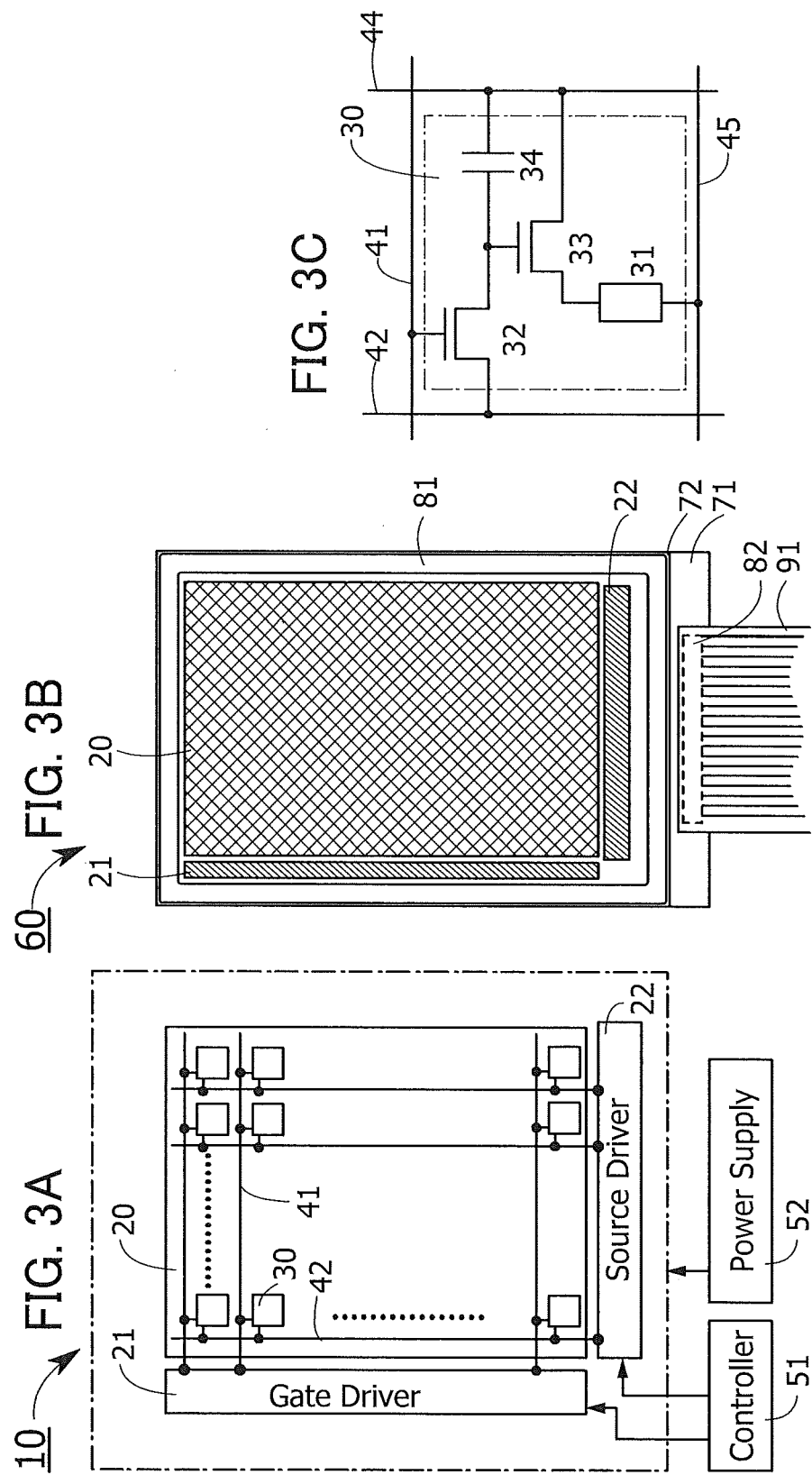

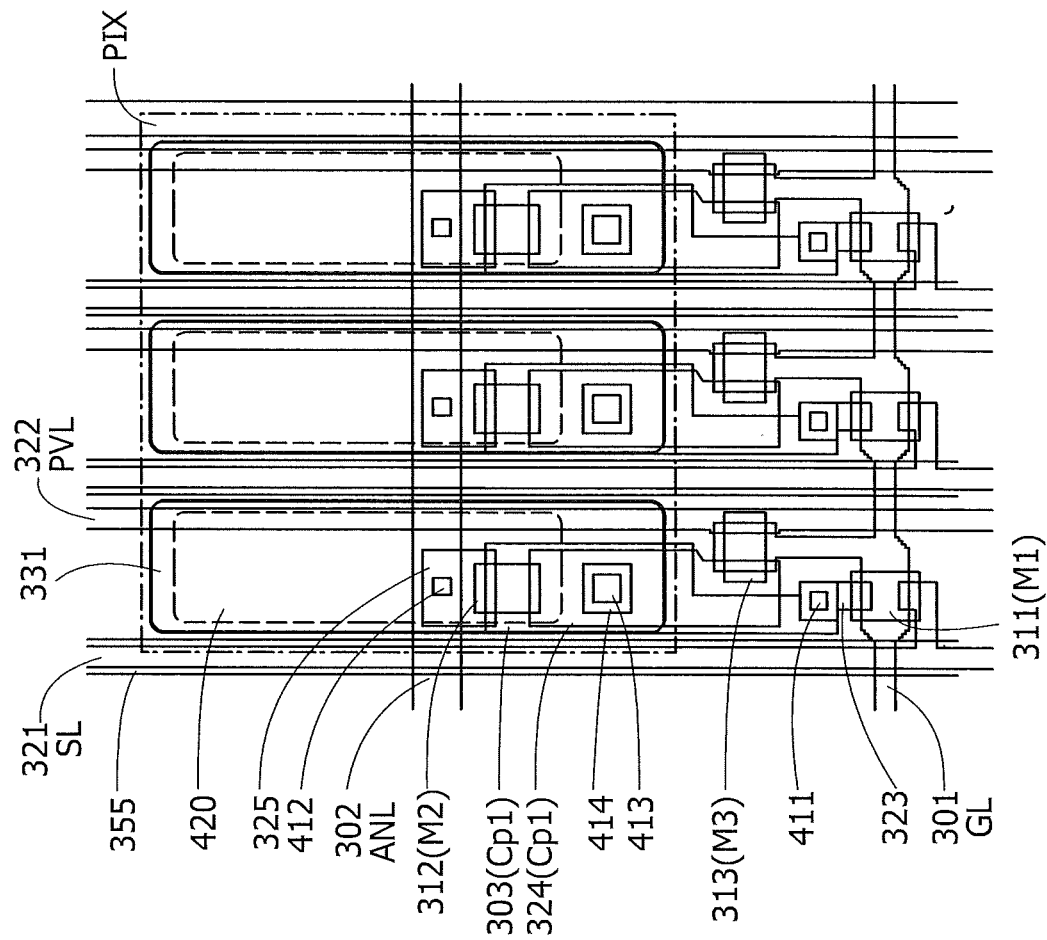
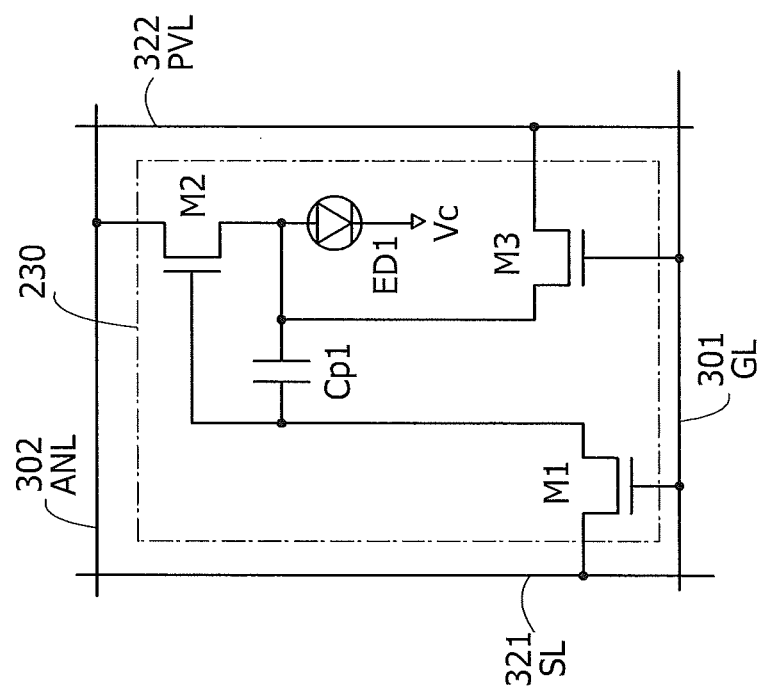
FIG. 5B
FIG. 5A

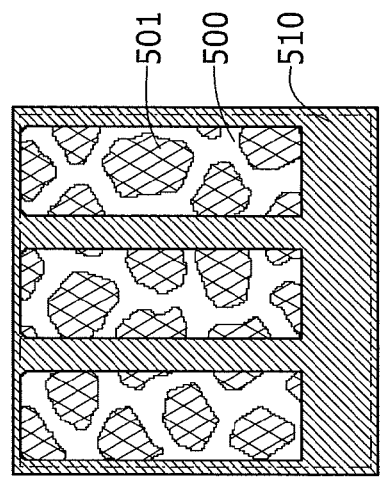
FIG. 9A
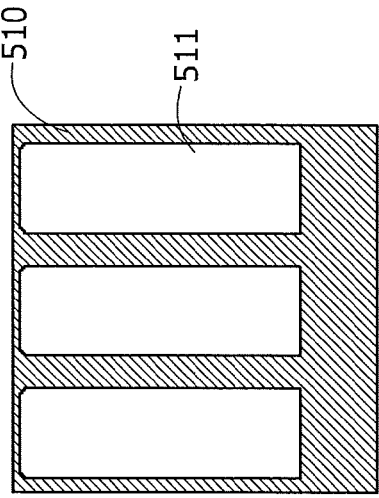
FIG. 9B
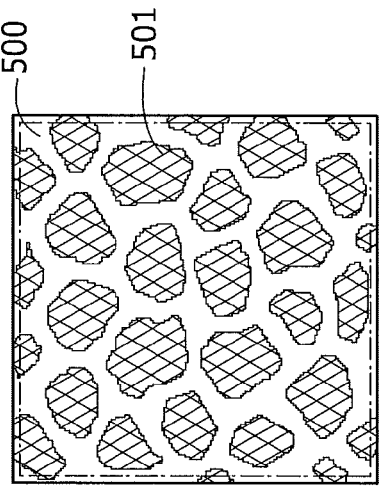
FIG. 9C
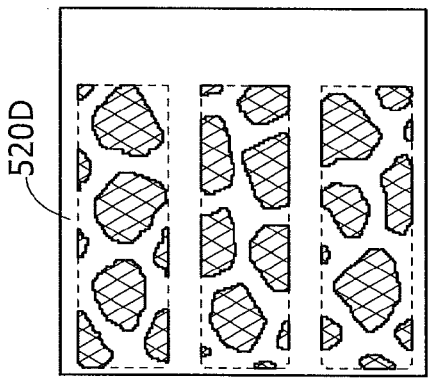
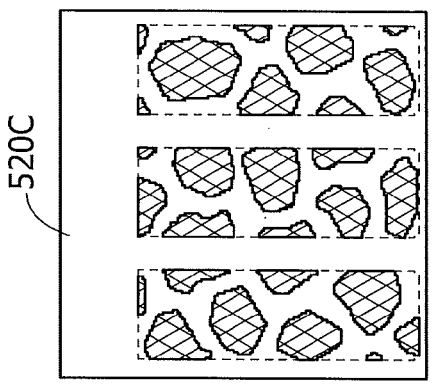
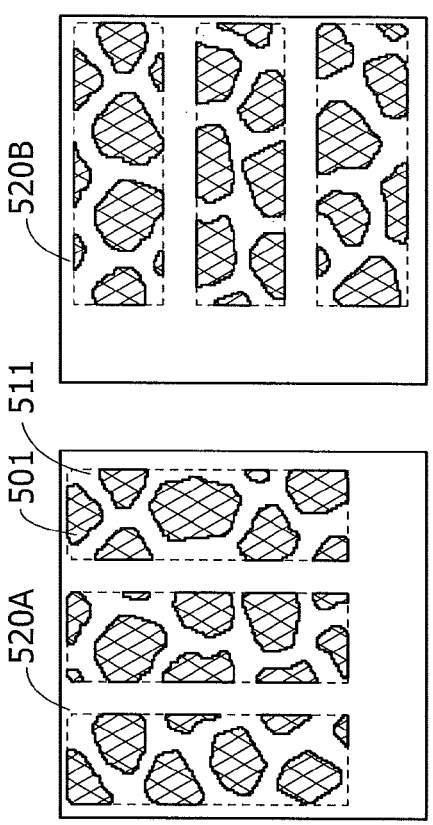
FIG. 9D

LIGHT-EMITTING DEVICE HAVING AN ELECTRODE WITH DEPRESSIONS

BACKGROUND OF THE INVENTION

1. Field of the Invention

The present invention relates to a light-emitting device including a light-emitting element such as an electroluminescence (EL) element.

2. Description of the Related Art

EL display devices are known as active matrix display devices. A screen of an active matrix EL display device includes a plurality of pixel circuits. Each pixel circuit is provided with an EL element. In the EL display device, the pixel circuit controls the luminance of the EL element so that gray scale display is performed.

In the general structure of an EL element provided in a pixel circuit, a light-emitting layer is provided between a pair of electrodes of an electrode having a light-transmitting property and an electrode having a light-reflecting property. Light generated from the light-emitting layer is reflected by the electrode having a light-reflecting property, passes through the electrode having a light-transmitting property, and is extracted. In general, an electrode having a light-transmitting property (hereinafter it may be referred to as a light-transmitting electrode) and an electrode having a light-reflecting property (hereinafter it may be referred to as a reflective electrode) functions as a cathode and an anode, respectively, in an EL element.

In a screen of an EL display device, a number of reflective electrodes are regularly arranged. Thus, there is a problem in that these reflective electrodes function like mirrors and reflect an image in the screen. Further, the regular arrangement of the reflective electrodes might cause diffraction of light reflected by each reflective electrode, so that interference fringes might appear on the screen. One method for solving such a problem is to make the surface of the reflective electrode uneven. In Patent Documents 1 and 2, to form projections and depressions on and in the surface of a reflective electrode, a light-transmitting electrode (cathode), a light-emitting layer, and a metal electrode (anode) are stacked in this order over a resin film having dot-like projections and depressions.

REFERENCE

[Patent Document 1] Japanese Published Patent Application No. 2000-040584

[Patent Document 2] Japanese Published Patent Application No. 2003-243152

SUMMARY OF THE INVENTION

In Patent Documents 1 and 2, however, the planar shapes of the dots formed on and in the surface of the resin film are circles with high symmetry.

In view of the above, an object of one embodiment of the present invention is to provide a light-emitting device in which an increase in irregularity of a surface shape of a reflective electrode can inhibit occurrence of interference fringes and reflection of images due to reflection of outside light. Another object of one embodiment of the present invention is to provide a light-emitting device in which irregularity of a surface shape of a reflective electrode is increased and which easily has a larger screen and higher definition.

One embodiment of the present invention is a light-emitting device including a first electrode, a light-emitting layer over the first electrode, and a second electrode overlapping the first electrode with the light-emitting layer interposed therebetween. A surface of a region of the first electrode which is overlapped with the light-emitting layer and the second electrode is provided with a plurality of depressions. Planar shapes of the plurality of depressions are different from each other and do not have rotational symmetry.

In the above embodiment, the depth of the depression can be, for example, greater than or equal to 0.2 μm and less than or equal to 1.5 μm. Further, the tilt angle of the depression can be greater than or equal to 2° and less than or equal to 15°. Furthermore, the diameter of the circumcircle of the planar shape of the depression can be greater than or equal to 5 μM and less than or equal to 30 μm.

According to one embodiment of the present invention, it is possible to provide a light-emitting device in which an increase in irregularity of a surface shape of a reflective electrode can inhibit occurrence of interference fringes and reflection of images due to reflection of outside light. According to one embodiment of the present invention, it is possible to provide a light-emitting device in which irregularity of a surface shape of a reflective electrode is increased and which easily has a larger screen and higher definition.

BRIEF DESCRIPTION OF THE DRAWINGS

In the accompanying drawings:

FIG. 2A is a top view illustrating a structural example of a reflective electrode layer, FIG. 2B is a cross-sectional view illustrating the structural example of the reflective electrode layer, and FIG. 2C is a top view illustrating an example of the planar shape of a depression;

FIG. 3A is a block diagram illustrating a structural example of an EL display device, FIG. 3B is a plan view illustrating a structural example of an EL panel, and FIG. 3C is a circuit diagram illustrating a configuration example of a pixel circuit;

FIG. 5A is a circuit diagram illustrating a configuration example of a pixel circuit, and FIG. 5B is a plan view illustrating an example of planar layout of the pixel circuit;

FIG. 9A is a plan view illustrating an example of a basic pattern of a depression layout, FIG. 9B is a plan view illustrating an example of a basic pattern of a region where a depression is formed, FIG. 9C is a plan view illustrating a forming method of a basic mask pattern of a photomask for forming a depression, and FIG. 9D shows plan views of the basic mask patterns;

FIGS. 10A to 10E each illustrate a design example of a photomask for forming a depression.

DETAILED DESCRIPTION OF THE INVENTION

Figure 1:
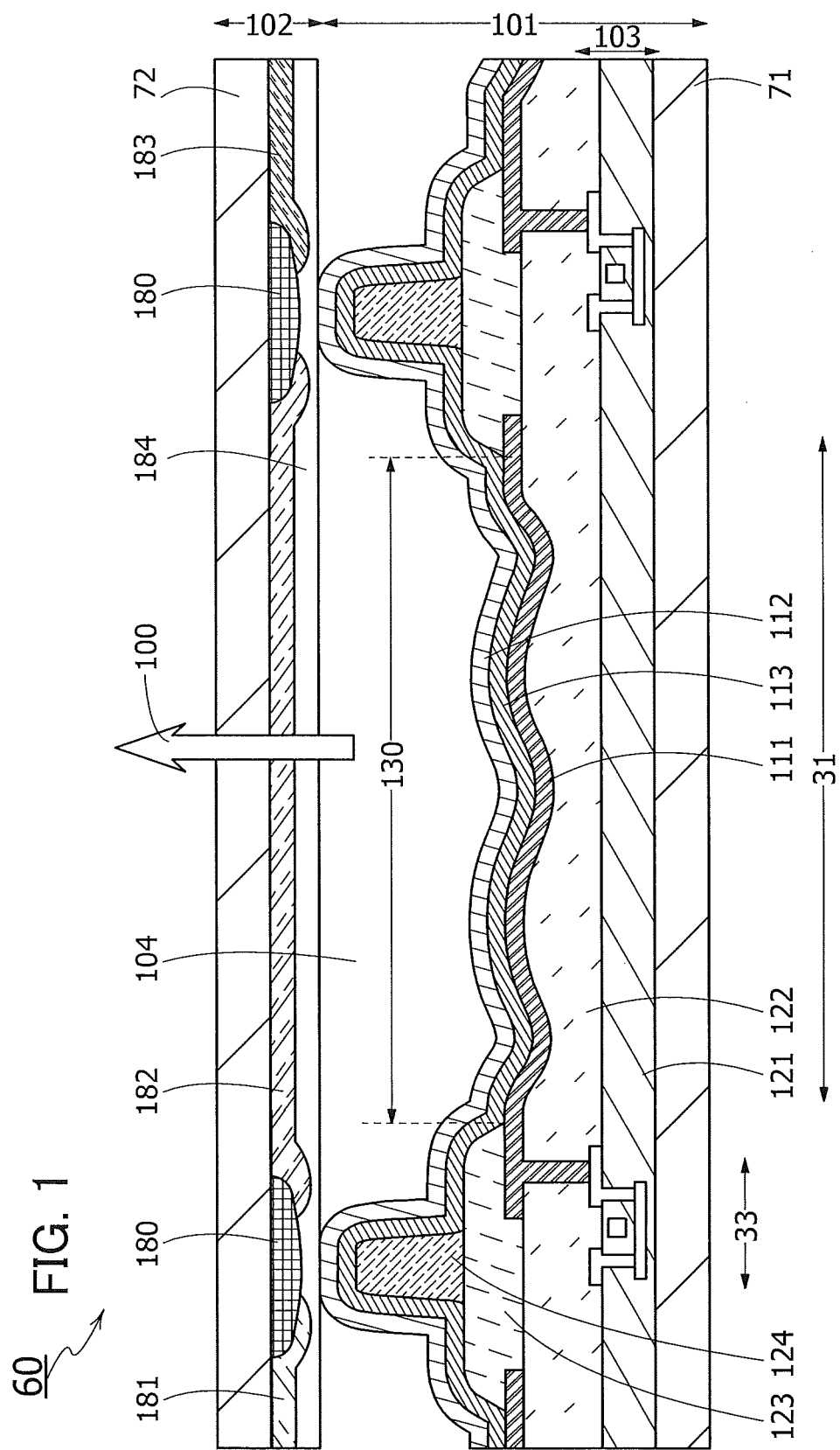
FIG. 1 is a cross-sectional view illustrating a structural example of an EL panel.

Hereinafter, embodiments of the present invention will be described in detail with reference to the accompanying drawings. Note that the present invention is not limited to the description below, and it will be readily appreciated by those skilled in the art that modes and details of the present invention can be changed in various ways without departing from the spirit and scope of the present invention. Therefore, the present invention should not be construed as being limited to the description of the embodiments below.

In the drawings used for the description of embodiments of the present invention, the same portions or portions having a similar function are denoted by the same reference numerals, and the repeated description thereof is omitted.

Note that in this specification, a semiconductor device means a circuit including a semiconductor element (e.g., a transistor or a diode) and a device including the circuit. The semiconductor device also means any device that can function by utilizing semiconductor characteristics. For example, an integrated circuit, a chip having an integrated circuit, a display device, a light-emitting device, a lighting device, and an electronic device are all semiconductor devices.

(Embodiment 1)

This embodiment will be described with reference to FIG. 1, FIGS. 2A to 2C, and FIGS. 3A to 3C. In this embodiment, an active matrix electroluminescence display device will be described as an example of a light-emitting device. An EL display device is a light-emitting device including an EL panel, a controller, a power supply circuit, and the like and is also a semiconductor device.

<Structural Example of EL Display Device>

FIG. 3A is a block diagram illustrating a structural example of an active matrix EL display device. FIG. 3B is a plan view illustrating a structural example of an EL panel included in an EL display device. FIG. 3C is a circuit diagram illustrating a configuration example of a pixel circuit.

As illustrated in FIG. 3A, an EL display device 10 includes a pixel portion 20, a gate driver 21, a source driver 22, a controller 51, a power supply circuit 52, and the like.

The pixel portion 20 includes a plurality of pixel circuits that are arranged in array, a plurality of gate lines 41 arranged in the vertical direction, and a plurality of source lines 42 arranged in the horizontal direction. The pixel circuits 30 in the same row are connected to the gate line 41 in the row, and the pixel circuits 30 in the same column are connected to the source line 42 in the column.

The controller 51 controls the EL display device 10. The controller 51 generates a data signal to be input to the pixel portion 20, a synchronization signal for controlling rewriting of a screen, and the like from an image signal. Examples of the synchronization signal include a horizontal synchronization signal, a vertical synchronization signal, and a reference clock signal.

The power supply circuit 52 has a function of supplying power supply voltage to the pixel portion 20 and the drivers 21 and 22.

The source lines 42 are connected to the source driver 22. The source driver 22 has a function of outputting a data signal input from the controller 51 to the source lines 42.

The gate lines 41 are connected to the gate driver 21. The gate driver 21 has a function of outputting a gate signal to the gate lines 41 in response to a control signal input from the controller 51. A gate signal is for selecting the pixel circuit 30 to which a data signal is to be input.

FIG. 3B illustrates a structural example of an EL panel where the pixel portion 20 and the drivers 21 and 22 are formed over one substrate. An EL panel may be called an EL module. An EL panel 60, and the controller 51, the power supply circuit 52, and the like of the EL panel 60 are contained in a housing, whereby the EL display device 10 is formed.

As illustrated in FIG. 3B, the EL panel 60 includes substrates 71 and 72. The substrate 71 is provided with the pixel portion 20, the drivers 21 and 22, and a terminal portion 82. Note that some or all of circuits included in the drivers 21 and 22 may be packaged on an IC chip, and the IC chip may be mounted on the substrate 71.

There is no particular limitation on a method for mounting the IC chip. A method of providing a bare chip directly on the substrate 71 (chip on glass (COG)) may be employed. Alternatively, the IC chip may be packaged on a tape carrier package (TCP) or a system on film (SOF), and the TCP or the SOF may be mounted on the substrate 71.

A plurality of terminals for connecting the pixel portion 20 and the drivers 21 and 22 to an external circuit are formed in the terminal portion 82. A flexible printed circuit (FPC) 91 is connected to the terminal portion 82. Note that the EL panel may have a structure where the FPC 91 is not connected to the terminal portion 82.

A sealant 81 is provided in a peripheral portion of a region where the substrate 71 faces the substrate 72. The substrate 72 is fixed to the substrate 71 by the sealant 81. For example, in the case where the EL panel 60 has a top emission structure, light from an EL element in the pixel portion 20 is emitted to the outside through the substrate 72.

FIG. 3C is a circuit diagram illustrating a configuration example of the pixel circuit 30. The pixel circuit 30 includes at least a circuit portion including an EL element 31, a transistor that controls light emission of the EL element 31, and the like. The circuit portion is provided with at least a current source of the EL element 31 and a switch that connects the pixel circuit 30 to the source line 42. In the example of FIG. 3C, the circuit portion includes transistors 32 and 33 and a capacitor 34.

The EL element 31 includes two electrodes (an anode and a cathode) and a light-emitting layer between the two electrodes. The EL element 31 is capable of changing emission intensity in accordance with current that flows between the two electrodes. One electrode of the EL element 31 is connected to a wiring 45 to which constant voltage is input. The light-emitting layer contains at least a light-emitting substance. Examples of the light-emitting substance include organic EL materials, inorganic EL materials, and the like. Light emission from the light-emitting layer includes light emission (fluorescence) generated in returning from a singlet excited state to a ground state and light emission (phosphorescence) generated in returning from a triplet excited state to a ground state.

The transistor 32 functions as a switch for controlling connection between the pixel circuit 30 and the source line 42 and connects the source line 42 and a gate of the transistor 33. The gate line 41 is connected to a gate of the transistor 32.

The transistor 33 functions as a current source of the EL element 31 and connects the EL element 31 and a wiring to which constant voltage is input. The source-drain current of the transistor 33 is controlled by the gate voltage of the transistor 33. Thus, the luminance of the EL element 31 is adjusted by the voltage of a data line that is input to the source line 42.

The capacitor 34 functions as a storage capacitor that holds the gate voltage of the transistor 33.

<Configuration of Pixel Circuit>

A specific structure of the EL panel 60 will be described below with reference to FIG. 1. In this embodiment, that an increase in irregularity of a surface shape of a reflective electrode of the EL element inhibits interference fringes and reflection of images due to light reflected by the reflective electrode will be described.

FIG. 1 is a cross-sectional view of a structural example of the EL panel 60 and illustrates an example of a layered structure of the pixel circuit 30. The EL panel 60 includes a circuit board 101 serving as a back plane of the EL panel 60 and a color filter (CF) substrate 102. Here, the EL panel 60 has a top-emission structure where light 100 emitted from the EL element 31 is extracted from the CF substrate 102 side.

<Structural Example of Circuit Board>

The circuit board 101 includes a transistor layer 103 over the substrate 71 and the EL element 31 over the transistor layer 103. The transistor layer 103 is provided with transistors, capacitors, and wiring groups that are included in the pixel portion 20 and the drivers 21 and 22. In FIG. 1, as a typical example, the transistor 33 of the pixel circuit 30 and an insulating layer 121 are illustrated.

There is no particular limitation on the structure of the transistor 33; a transistor suitable for the characteristics of a circuit formed on the circuit board 101 is used. The transistor 33 can have either a top-gate structure as illustrated in FIG. 1 or a bottom-gate structure. Further, for a semiconductor layer in the transistor 33, a semiconductor film having a single-layer structure or a multilayer structure using any of an amorphous silicon film, a polycrystalline silicon film, a single crystal silicon film, and an oxide semiconductor film can be used.

The insulating layer 121 can be either a single-layer film or a stack including two or more layers, and there is no particular limitation on the thickness thereof. The top surface of the insulating layer 121 is preferably planar. Examples of an insulating film included in the insulating layer 121 include a silicon oxide insulating film, a silicon oxinitride insulating film, an aluminum oxide insulating film, an acrylic resin insulating film, a polyimide resin insulating film, a benzocyclobutene resin film, a polyamide resin film, an epoxy resin insulating film, a siloxane-based resin insulating film, an SOG insulating film, and a polysilazane-based SOG insulating film.

The transistor layer 103 is covered with the insulating layer 122. A reflective electrode layer 111, a light-emitting layer 113, and a light-transmitting electrode layer 112 are stacked over the insulating layer 122. The stack including these layers forms the EL element 31. The reflective electrode layer 111 is connected to the transistor 33 through an opening formed in the insulating layer 122. The reflective electrode layer 111 is a conductive layer serving as an anode of the EL element 31. The light-transmitting electrode layer 112 is a conductive layer serving as a cathode of the EL element 31.

The light-emitting layer 113 contains a light-emitting substance. Examples of the light-emitting substance include a fluorescent compound (e.g., coumarin 545T) and a phosphorescent compound (e.g., tris(2-phenylpyridinato)iridium (III) (abbreviation: Ir(ppy)$_3$)). A phosphorescent compound is preferably used as the light-emitting substance, in which case the emission efficiency of the EL element 31 can be enhanced.

The EL element 31 may include a layer other than the light-emitting layer 113 between the reflective electrode layer 111 and the light-transmitting electrode layer 112. The EL element 31 includes at least one light-emitting layer containing a light-emitting substance, and may have a structure in which the light-emitting layer and a layer other than the light-emitting layer are stacked. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, and a layer containing a substance having a bipolar property (a substance having a high electron-transport property and a high hole-transport property).

A plurality of depressions are randomly formed in part of a surface of the insulating layer 122. The reflective electrode layer 111 is formed in contact with a surface of the insulating layer 122; thus, a plurality of depressions reflecting projections and depressions of the surface of the insulating layer 122 are formed. The plurality of depressions are randomly formed in the surface of the reflective electrode layer 111, which can inhibit interference of a plurality of light rays reflected by the reflective electrode layer 111 in the pixel portion 20.

The insulating layer 122 can be formed in a manner similar to that of the insulating layer 121. Here, a plurality of depressions are formed in the surface of the insulating layer 122; thus, the insulating layer 122 is preferably formed using a photosensitive resin material that is easy to process (e.g., photopolymer, photosensitive acrylic, or photosensitive polyimide).

The reflective electrode layer 111 can have either a single-layer structure or a layered structure where a plurality of films are stacked, and there is no particular limitation on the thickness thereof The reflective electrode layer 111 includes at least one light-reflective conductive film that can reflect the light 100. Examples of the light-reflective conductive film include a metal film of molybdenum, titanium, tantalum, tungsten, aluminum, silver, copper, chromium, neodymium, scandium, or the like, or an alloy film that contains any of these metals.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. An alloy containing gold and copper may be used. Further, a metal nitride can be used for the light-reflective conductive film. Specifically, a metal nitride film of titanium nitride, molybdenum nitride, tungsten nitride, or the like can be used.

For example, a film having a two-layer structure where a titanium film is stacked over a film containing an aluminum-nickel-lanthanum alloy can be formed as the reflective electrode layer 111.

Alternatively, a layered film in which a light-transmitting conductive film that transmits visible light is stacked over a light-reflective conductive film may be formed as the reflective electrode layer 111. Examples of the light-transmitting conductive film include a film containing a metal oxide such as indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added.

In the circuit board 101, an insulating layer 123 is formed over the insulating layer 122. An opening 130 is formed in a region of the insulating layer 123 that overlaps the insulating layer 121. The insulating layer 123 serves as a partition that separates the EL elements 31 in the adjacent pixel circuits 30. A region where the reflective electrode layer 111, the light-emitting layer 113, and the light-transmitting electrode layer 112 are stacked in the opening 130 serves as the EL element 31.

An insulating layer 124 is formed over the insulating layer 123 and has a function of a spacer that maintains a gap between the circuit board 101 and the CF substrate 102.

The insulating layer 123 and the insulating layer 124 can each have either a single-layer structure or a layered structure including two or more layers, and there is no particular limitation on the thicknesses thereof. The insulating layer 123 and the insulating layer 124 are preferably formed using a photosensitive resin material such as photopolymer, photosensitive acrylic, or photosensitive polyimide. The insulating layer 124 may be formed using an inorganic insulating material that can be formed by a CVD method, a sputtering method, or the like, such as silicon oxide.

The light-emitting layer 113 and the light-transmitting electrode layer 112 are stacked in the whole pixel portion 20 so as to cover the insulating layer 123 and the insulating layer 124. Here, the EL elements 31 in all the pixel circuits 30 emit light in the same wavelength range. Specifically, a layer that emits white light is used as the light-emitting layer 113. The light-emitting layer 113 can have either a single-layer structure or a layered structure including two or more layers.

The light-transmitting electrode layer 112 can have either a single-layer structure or a layered structure, using a light-transmitting conductive film that transmits visible light. Examples of the conductive film that transmits visible light include a film containing a metal oxide such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added. Alternatively, a metal (e.g., silver) film that is thin enough to transmit light (preferably has a thickness of approximately greater than or equal to 5 nm and less than or equal to 30 nm) may be used.

Instead of the light-transmitting electrode layer 112, a semi-transmissive electrode layer (also referred to as a transflective electrode layer) having both a light-reflecting property and a light-transmitting property may be provided. The semi-transmissive electrode layer can be formed of, for example, a layered film of a metal thin film (preferably has a thickness of less than or equal to 20 nm, more preferably less than or equal to 10 nm) and the above-described light-transmitting metal oxide film. As the metal thin film, a film with a single-layer structure or a layered structure using silver, magnesium, or an alloy containing such a metal material can be used.

The use of the semi-transmissive electrode layer allows the EL element 31 to have a micro-cavity structure. In a micro-cavity structure, part of light emission from the light-emitting layer 113 is repeatedly reflected between the reflective electrode layer 111 and the semi-transmissive electrode layer; accordingly, the intensity of light in a specific wavelength range can be increased and extracted.

<Structural Example of CF Substrate>

The CF substrate 102 may also called a counter substrate. The CF substrate 102 is provided with a black matrix and a color filter. The substrate 72 is provided with color filter layers 181 to 183. The color filter layers 181 to 183 are optical filter layers for converting the light (white light) 100 emitted by the light-emitting layer 113 into light of different colors. For example, when the color filter layers 181 to 183 are color filters of red, green, and blue, color display can be performed on the EL panel 60. Note that the substrate 71 may be provided with the color filter layers 181 to 183.

In the case where the light-emitting layer 113 is provided for each pixel color (e.g., red, green, and blue), a color filter is not necessarily provided.

A light-blocking layer 180 has a function of blocking light that is transmitted through the substrate 72 and enters the EL panel 60. The light-blocking layer 180 can have either a single-layer structure or a layered structure including two or more layers. Examples of a film included in the light-blocking layer 180 include a film containing a macromolecular material in which chromium, titanium, nickel, or carbon black is dispersed, or the like.

An overcoat layer 184 has functions of planarizing the surface of the CF substrate 102 and preventing diffusion of impurities (such as water and/or oxygen). The overcoat layer 184 can be formed using, for example, a polyimide resin, an epoxy resin, an acrylic resin, or the like.

Further, the CF substrate 102 may be provided with a drying agent to prevent the EL element 31 from deteriorating. For a similar reason, a space 104 between the substrate 71 and the substrate 72 is preferably filled with an inert gas such as a nitrogen gas or an argon gas or a solid substance such as a resin material. Filling the space with a substance with a high refractive index (e.g., a resin) can increase outcoupling of the light 100.

As the substrate 71, a substrate having heat resistance high enough to resist a fabricating process of the circuit board 101 can be used. As the substrate 72, a substrate having heat resistance high enough to resist a fabricating process of the CF substrate 102 can be used.

Examples of substrates that can be used as the substrates 71 and 72 include a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, and a polyimide substrate.

Supporting substrates (e.g., glass substrates) used in fabricating the circuit board 101 and the CF substrate 102 are separated, and flexible substrates may be attached with a bonding layer. A typical example of each of the flexible substrates is a plastic substrate. In addition, thin glass with a thickness of greater than or equal to 50 μm and less than or equal to 500 μm, metal foil, or the like can be used. The use of flexible substrates as the substrates 71 and 72 enables the EL panel 60 itself to be bent.

<Structural Example of Reflective Electrode Layer (Reflective Electrode)>

According to this embodiment, irregularity of a surface shape of the reflective electrode of the EL element can be further increased; thus, it is possible to inhibit interference fringes and reflection of images due to outside light reflected by a screen of the EL panel. The structure of the reflective electrode will be described in detail below with reference to FIGS. 2A to 2C.

FIG. 2A is a plan view illustrating a structural example of the reflective electrode layer 111, and FIG. 2B is a cross-sectional view thereof. FIG. 2C is a plan view illustrating a structural example of a depression formed in the surface of the reflective electrode layer 111.

A plurality of depressions 141 reflecting the surface shape of the insulating layer 122 are formed in the surface of the reflective electrode layer 111. As illustrated in FIG. 2A, the plurality of depressions are formed in a region 140 of the insulating layer 122. Here, the depressions 141 are formed only in a region of the insulating layer 122 in which the EL element 31 is stacked. The region 140 includes the whole region of the insulating layer 123 in which the opening 130 is formed.

An opening 142 is formed in the insulating layer 122, and the reflective electrode layer 111 is connected to the transistor 33 through the opening 142. Here, the opening 142 is formed so as not to be included in the region 140; this is for preventing poor connection between the reflective electrode layer 111 and the transistor 33 in the opening 142.

As illustrated in FIG. 2A, the planar shapes of the plurality of depressions 141 formed in the surface of one reflective electrode layer 111 are preferably different shapes not having rotational symmetry unlike a circle or a regular polygon. This can increase irregularity of the surface shape of the reflective electrode layer 111, so that interference of light reflected by the reflective electrode layer 111 is not likely to occur.

Note that the reflective electrode layer 111 preferably has a curved surface due to the depressions 141. This is because a too large difference in height of the reflective electrode layer 111 makes it difficult to form the light-emitting layer 113 over the surface of the reflective electrode layer 111 and decreases outcoupling of the light 100 to the outside of the substrate 72. For this reason, a depth D1 of the depression 141 is, for example, greater than or equal to 0.2 μm and less than or equal to 1.5 μm, and is preferably greater than or equal to 0.2 μm and less than or equal to 1.2 μm.

A tilt angle θ1 of the depression 141 is greater than or equal to 2° and less than or equal to 15°, preferably greater than or equal to 2° and less than or equal to 12°.

The depth D1 and the tilt angle θ1 of the depression 141 will be described with reference to FIG. 2B. The depth D1 can be calculated from a difference between a thickness H1 of the thickest portion (referred to as a mountain of the depression) and a thickness H2 of the thinnest portion (referred to as a valley of the depression) of the insulating layer 122 in the depression 141. That is, D1=H1−H2 is satisfied.

The tilt angle θ1 refers to an angle formed by extension lines L01 and L02 in the cross section of the reflective electrode layer 111. The extension line L01 in the cross section of the reflective electrode layer 111 is a straight line that passes through the bottom of the valley of the depression 141 and is parallel to the surface of the substrate 71. The extension line L02 is a straight line that passes through the top of the mountain and the bottom of the valley of the depression 141.

The size of the planar shape of the depression 141 is, depending on the size of the region 140 (the reflective electrode layer 111), greater than or equal to 5 μm and less than or equal to 30 μm. Note that the size of the depression 141 can be determined by a diameter φ1 of a circumcircle Cir01 of the depression 141 as illustrated in FIG. 2C and by a distance between mountains of the depression 141 in the cross section of the reflective electrode layer 111. When the depressions 141 are too small, the light 100 is scattered by the surface of the reflective electrode layer 111, decreasing outcoupling of the light 100. Further, when the depressions 141 are too large, an effect of inhibiting interference fringes is hardly achieved.

The size of the depression 141 including the border of the region 140, like a depression 141a, may be less than or equal to 10 μm. In the plurality of depressions 141 that are formed in the region 140 of one reflective electrode layer 111, the proportion of the depressions 141 each having a size of greater than 10 μm and less than 30 μm to all of the depressions 141 is higher than or equal to 60%.

Although the shapes and sizes of the plurality of depressions 141 are different from each other as illustrated in FIG. 2A, the depressions 141 are preferably arranged at the same density in the plurality of reflective electrode layers 111. For example, the proportion of the total area of the depressions 141 to the area of the region 140 (or the opening 130) is higher than or equal to 30% and lower than or equal to 70%, preferably higher than or equal to 40% and lower than or equal to 60%.

By forming the plurality of depressions 141 whose shapes and sizes are different from each other in the surface of the reflective electrode layer 111 as illustrated in FIGS. 2A to 2C, the projections and depressions of the surface of the reflective electrode layer 111 can be randomly varied. This can inhibit interference of light reflected by the plurality of reflective electrode layers 111 in the pixel portion 20, making interference fringes difficult to appear in the screen of the EL panel 60.

The thickness of the reflective electrode layer 111 is approximately several hundred nm; thus, the depressions formed in the insulating layer 122 should have shapes similar to those of the depressions 141 in order that the depressions 141 be formed in the above-described manner. Therefore, the shapes of the depressions 141 described with reference to FIGS. 2A to 2C can be applied to the depressions formed in the insulating layer 122.

A method for making the surface of the reflective electrode layer 111 uneven is not limited to the method of forming the plurality of depressions in the surface of the insulating layer 122. A conductive film to be the reflective electrode layer 111 may be formed over the insulating layer 122 having a plane surface and a plurality of depressions or projections may be formed in or on the surface of the conductive film.

Although the EL panel 60 has a top-emission structure, a bottom-emission structure may be employed. In that case, a conductive film to be the reflective electrode layer 111 and a conductive film to be the light-transmitting electrode layer 112 are replaced with each other. The surface shapes of the light-emitting layer 113 and the reflective electrode layer formed over the light-emitting layer 113 are each uneven like the surface shape of the light-transmitting electrode layer 112.

This embodiment can be implemented in combination with any of the other embodiments as appropriate.

(Embodiment 2)

The plurality of depressions with different shapes are formed in the surface of the reflective electrode of the EL element as described in Embodiment 1; however, it is difficult, in design, to make the surface shapes of all the reflective electrodes different from each other in the entire pixel portion. In view of the above, in this embodiment, a light-emitting device in which irregularity of the surface shape of a reflective electrode is increased and which easily has a larger screen and higher definition will be described.

In this embodiment, an active matrix EL panel will be described as the light-emitting device.

Figure 4:
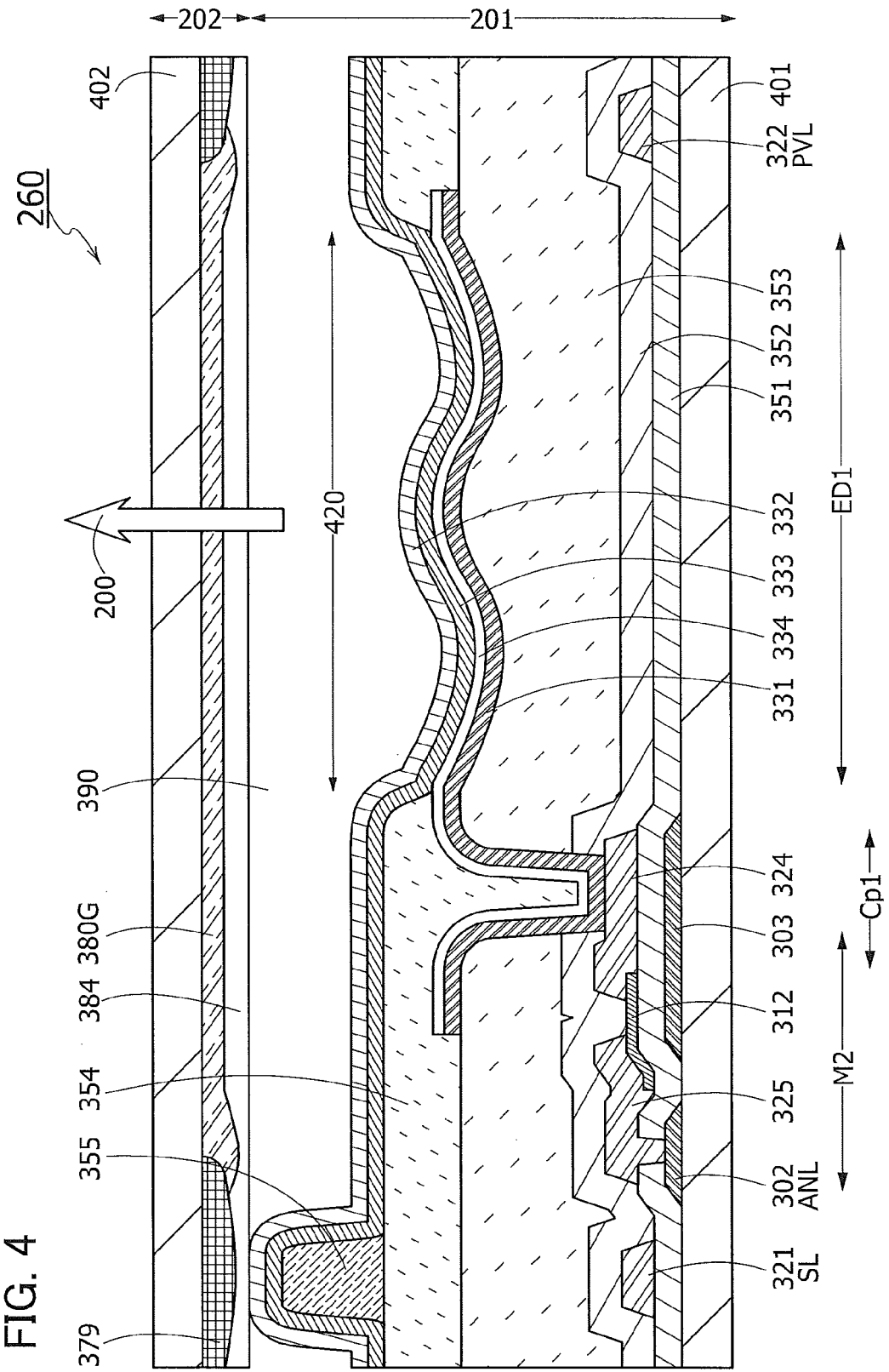
FIG. 4 is a cross-sectional view illustrating a structural example of an EL panel.

FIG. 4 is a cross-sectional view illustrating a structural example of the EL panel. FIG. 5A is a circuit diagram illustrating a configuration example of a pixel circuit, and FIG. 5B is a planar layout diagram of the pixel circuit.

As illustrated in FIG. 4, the EL panel 260 has a structure similar to that of the EL panel 60 (FIG. 1 and FIG. 3B); the EL panel 260 includes the circuit board 201 and the CF substrate 202. The CF substrate 202 is fixed to the circuit board 201 with a sealant (not illustrated). The EL panel 260 has a top-emission structure like the EL panel 60 and emits light 200 of a pixel portion from the CF substrate 202 side.

A light-emitting layer that emits white light is provided in an EL element included in the pixel portion, and the CF substrate 202 is provided with a color filter so that color display can be performed. A method for performing color display is not limited to this.

A circuit mounted on the circuit board 201 includes transistors of a single conductivity type; in this embodiment, the transistors are all n-channel transistors. Further, in this embodiment, the transistors formed in the circuit board 201 are each a transistor whose channel is formed in an oxide semiconductor layer. Hereinafter, such a transistor is referred to as an OS transistor.

<Configuration Example of Pixel Circuit: Circuit>

The pixel portion of the EL panel is provided with a plurality of gate lines 301 (hereinafter also referred to as GLs 301), a plurality of source lines 321 (hereinafter also referred to as SLs 321), power supply lines 302 (hereinafter also referred to as ANLs 302), and power supply lines 322 (hereinafter also referred to as PVLs 322).

The pixel circuit 230 includes an EL element ED1 (hereinafter also simply referred to as ED1), three transistors (M1, M2, and M3), and one capacitor Cp1. The transistor M1 is a switch that controls conduction between the pixel circuit 230 and the SL 321. A gate of the transistor M1 is connected to the GL 301, a drain of the transistor M1 is connected to the SL 321, and a source of the transistor M1 is connected to a gate of the transistor M2. The transistor M2 functions as a current source of ED1. A drain of the transistor M2 is connected to the ANL 302, and a source of the transistor M2 is connected to an anode of ED1. The capacitor Cp1 is connected between the gate of the transistor M2 and the anode of EDI. The transistor M3 has a function of keeping the voltage of the anode of ED1 when the transistor M1 is on. A gate of the transistor. M3 is connected to the GL 301, a drain of the transistor M3 is connected to the anode of ED1, and a source of the transistor M3 is connected to the PVL 322.

Here, for easy understanding of the function of the pixel circuit 230, the source and the drain of the transistors M1 to M3 are distinguished from each other. However, the source and the drain of the transistor may be interchanged with each other depending on the voltage applied to the transistor. Thus, a distinction between a source and a drain of a transistor in one embodiment of the present invention is not limited to the distinction between the source and the drain of the transistor in this embodiment. Here, the circuit includes n-channel transistors; therefore, a terminal (electrode) to which a high-level signal and high power supply voltage are mainly input is referred to as a drain, and a terminal (electrode) to which a low-level signal and low power supply voltage are mainly input is referred to as a source.

Here, constant voltage as power supply voltage is applied to a cathode of ED1, the ANL 302, and the PVL 322. Positive voltage as high power supply voltage is applied to the ANL 302, and negative voltage as low power supply voltage is applied to the cathode of ED1 and the PVL 322.

Note that power supply voltage applied to the cathode of ED1 is lower than power supply voltage applied to the PVL 322.

<Configuration Example of Pixel Circuit: Planar Layout and Layered Structure>

In the EL panel 260, the EL elements ED1 in all the pixel circuits 230 are light-emitting elements that emit white light and a color filter substrate is provided with a color filter of red, green, and blue (RGB), whereby color display is performed. Thus, a unit pixel (Pix) includes three pixel circuits 230 for RGB provided in the same row so as to be adjacent to each other. FIG. 5B corresponds to a planar layout of the unit pixel. FIG. 4 shows a cross section of the pixel circuit 230 in a cross section of the EL panel 260. FIG. 4 is not a cross-sectional view of the pixel circuit 230 taken along a specific line but a view for illustrating the layered structure of the pixel circuit 230. In FIG. 4, the transistor M2, the capacitor Cp1, and ED1 are illustrated.

<<Circuit Board>>

Structures and fabricating methods of the pixel circuits 230 will be described below with reference to FIG. 4, FIGS. 5A and 5B, FIGS. 6A and 6B, FIGS. 7A and 7B, and FIGS. 8A and 8B. Note that a source driver and a gate driver are also formed over the circuit board 201 in a fabricating process of the pixel circuit 230. Therefore, transistors and capacitors with structures similar to those of the transistor and the capacitor in the pixel circuit 230 are formed in the drivers. The circuit board 201 can be formed in a manner similar to that of the circuit board 101.

<Transistor and Capacitor>

Figure 6B:
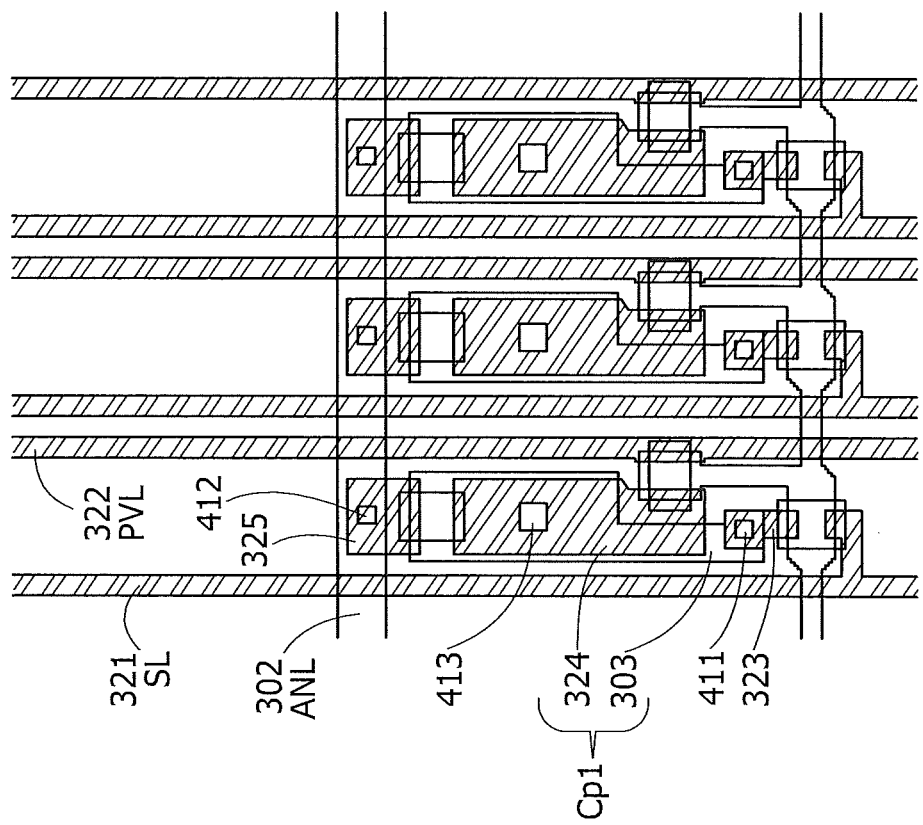
FIGS. 6A and 6B are plan views illustrating an example of a fabricating method of a pixel circuit.
Figure 6A:
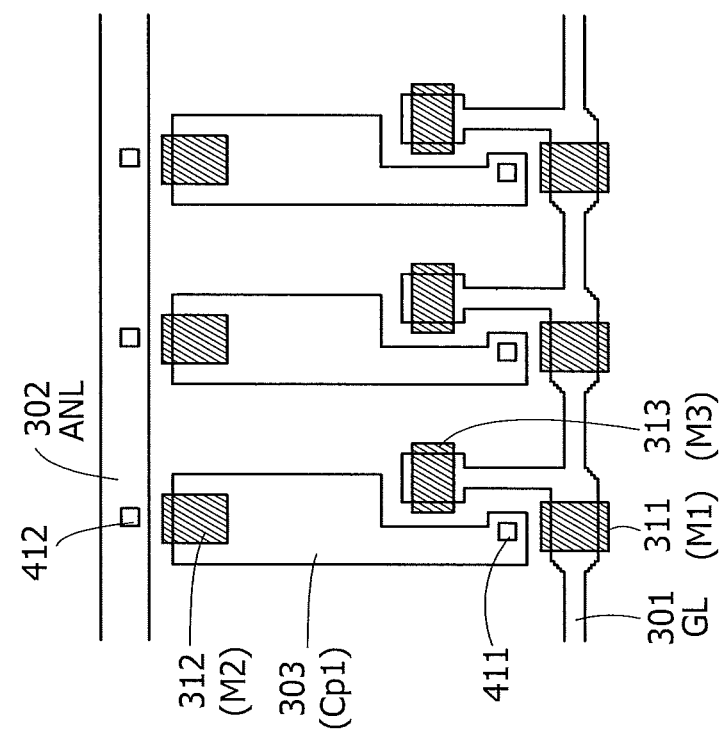

First, wirings and an electrode (the GL 301, the ANL 302, and an electrode 303) in a first layer are formed over a substrate 401 (FIG. 6A). The electrode 303 forms the gate electrode of the transistor M2 and a terminal (electrode) of the capacitor Cp1. The wirings and electrode (301, 302, and 303) in a first layer are formed using a conductive film with a single-layer structure or a layered structure including two or more layers. Examples of such a conductive film include a metal film of aluminum, chromium, copper, tantalum, titanium, molybdenum, tungsten, or the like, any of the metal films to which another metal element is added, an alloy film containing one or more kinds of the above metal elements, and a compound film containing one or more kinds of the above metal elements. For example, a tungsten film is formed to a thickness in the range from 180 nm to 250 nm by a sputtering method, and this tungsten film is processed in photolithography and etching steps to form the wirings and electrode (301 to 303) in the first layer.

Then, an insulating layer 351 is formed so as to cover the wirings and electrode (301 to 303) in the first layer (FIG. 4). The insulating layer 351 forms gate insulating layers in the transistors Ml to M3. The insulating layer 351 can have either a single-layer structure or a layered structure. Examples of a film that can be used for the insulating layer 351 include oxide films such as a silicon oxide film, an aluminum oxide film, and a hafnium oxide film, nitride films such as a silicon nitride film and aluminum nitride film, oxynitride films such as a silicon oxynitride film and an aluminum oxynitride film, and nitride oxide films such as a silicon nitride oxide film and an alumiunum nitride oxide film.

Note that in this specification, oxynitride refers to a substance that contains more oxygen than nitrogen, and nitride oxide refers to a substance that contains more nitrogen than oxygen.

For example, for the insulating layer 351, a silicon nitride film with a thickness in the range from 300 nm to 450 nm and a silicon oxynitride film with a thickness in the range from 20 nm to 100 nm are formed. Note that the silicon nitride film may be formed to have a layered film by performing a step of forming a silicon nitride film two or more times.

An oxide semiconductor layer 311, an oxide semiconductor layer 312, and an oxide semiconductor layer 313 are formed over the insulating layer 351 (FIG. 6A). An oxide semiconductor film with a single-layer structure or a layered structure including two or more layers are formed by a sputtering method, a coating method, a pulsed laser deposition method, a laser ablation method, or the like. As the oxide semiconductor film, a semiconductor film containing a metal oxide such as an In—Ga oxide, an In—Zn oxide, an In—M—Zn oxide (M is Al, Ti, Ga, Y, Zr, La, Ce, Nd, or Hf) can be formed.

Then, openings 411 and 412 are formed in the insulating layer 351 in photolithography and etching steps (FIG. 6A). The opening 411 is formed to connect the transistor M1 and the capacitor Cp1. The opening 412 is formed to connect the transistor M2 and the ANL 302.

Wirings and electrodes (the SL 321, the PVL 322, an electrode 323, an electrode 324, and an electrode 325) in a second layer are formed over the insulating layer 351 (FIG. 6B). The wirings and electrodes (321 to 325) in the second layer can be formed in a manner similar to that of the wirings and electrode (301 to 303) in the first layer. For example, a copper film is formed by a sputtering method and then processed in photolithography and etching steps, so that the wirings and electrodes (321 to 325) in the second layer are formed. Alternatively, the wirings and electrodes (321 to 325) in the second layer may be formed using a film having a three-layer structure of a titanium film, an aluminum film, and a titanium film.

The electrode 323 forms a source electrode of the transistor M1. The electrode 324 forms a drain electrode of the transistor M2 and an electrode (terminal) of the capacitor Cp1. A region where the insulating layer 351, the electrode 303, and the electrode 324 overlap each other forms the capacitor Cp1 that uses the insulating layer 351 as a dielectric (FIG. 4).

Through the above steps, the transistors M1 to M3 and the capacitor Cp1 are formed.

<EL Element>

Next, an insulating layer 352 is formed so as to cover the transistors M1 to M3 and the capacitor Cp1 (FIG. 4). The insulating layer 352 can be formed in a manner similar to that of the insulating layer 351. For example, a film having a three-layer structure of a silicon oxynitride film, a silicon oxynitride film, and a silicon nitride film is formed for the insulating layer 352. Then, the opening 413 is formed in the insulating layer 352 so as to reach the electrode 324 (FIG. 6B).

Figure 7A:
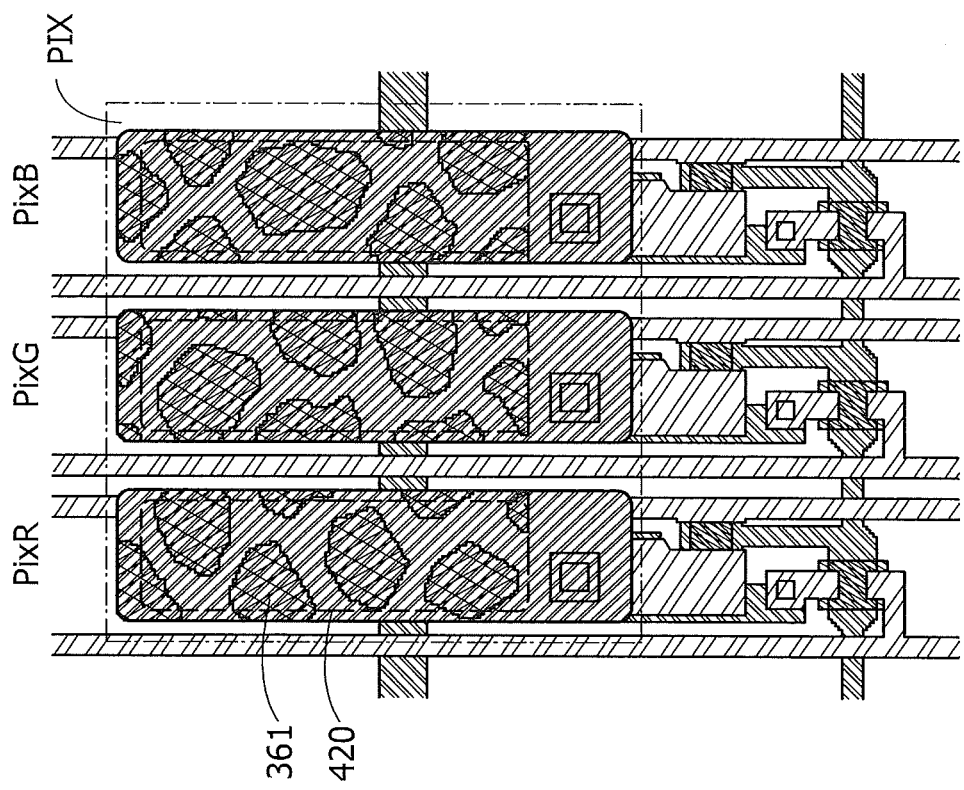
FIGS. 7A and 7B are plan views illustrating an example of a fabricating method of the pixel circuit.

The insulating layer 353 is formed so as to cover the insulating layer 352 (FIG. 4). Here, a plurality of depressions are formed in the insulating layer 353 like in the insulating layer 122 (see FIG. 1 and FIGS. 2A to 2C). Thus, here, the insulating layer 353 is formed using a photosensitive resin material that can be easily processed (e.g., photopolymer, photosensitive acrylic, or photosensitive polyimide). An opening 414 is formed in the insulating layer 353 to connect ED1 and the electrode 324 (FIG. 7A).

For example, the insulating layer 353 may be formed by performing an exposure step and a development step of a photosensitive resin material twice. First, a positive photosensitive resin material is applied to a surface of the insulating layer 352. Then, the photosensitive resin material is subjected to exposure treatment using a photomask that exposes a portion where the opening 414 is formed, and after that, development and baking steps are performed, so that a lower layer of the insulating layer 353 is formed. A positive photosensitive resin material is applied again and exposure, development, and baking steps are performed, whereby an upper layer of the insulating layer 353 is formed. A photomask that allows openings 414 and depressions 361 to be exposed to light is used in the second exposure step.

Through such steps, the insulating layer 353 having the depressions 361 is formed. As illustrated in FIG. 7A, a region 360 where the depressions 361 are formed and a region where a reflective electrode 331 serves as a cathode of ED1 overlap each other. Here, the depressions 361 are not formed in a region of the insulating layer 353 that is not overlapped with the reflective electrode 331.

Here, a unit pixel PIX includes three pixels of red, green, and blue (RGB) (PixR, PixG, and PixB). The planar shapes of all the depressions 361 in three regions 360 included in the unit pixel PIX are different from each other. By thus forming the plurality of depressions 361, uneven shapes of surfaces of the reflective electrodes 331 that are adjacent to each other in the column direction can be made different from each other. Therefore, when all the reflective electrodes in the pixel portion are regarded as one mirror surface, irregularity of the uneven shape of the mirror surface can be increased. The planar shapes and arrangement of the depressions 361 are determined in terms of the unit pixel PIX, whereby a photomask for forming the depressions 361 in the insulating layer 353 can be easily designed even when the EL panel 260 is increased in area or density.

Figure 7B:
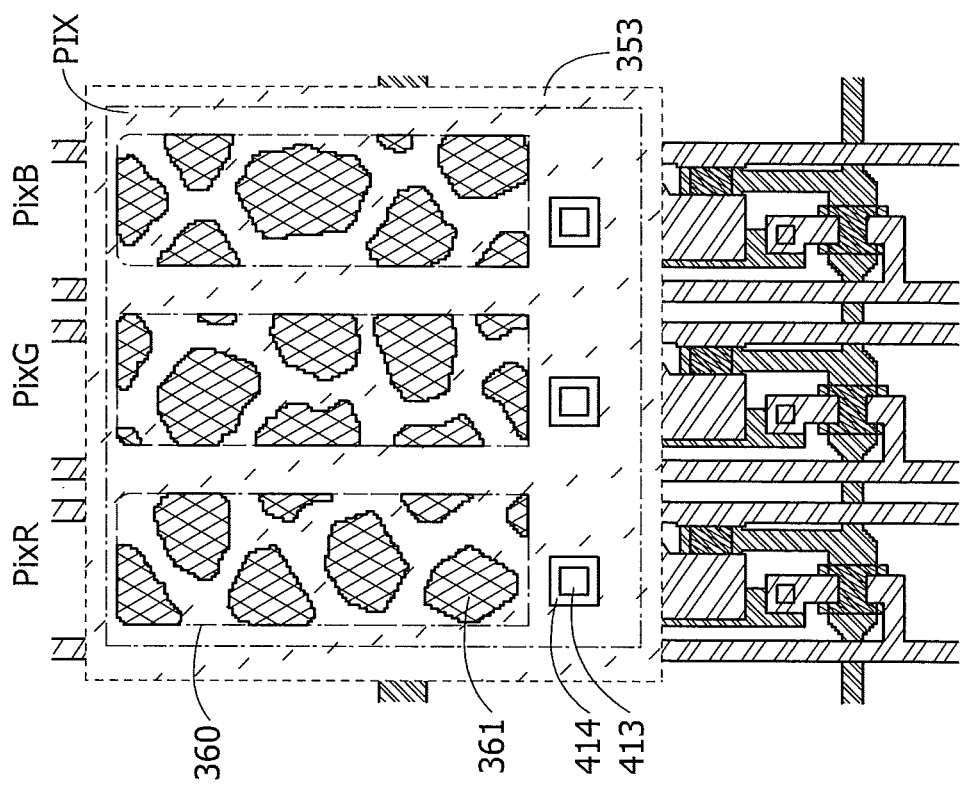

Next, the reflective electrode 331 is formed over the insulating layer 353 (FIG. 4 and FIG. 7B). Here, for example, a metal film with a three-layer structure of a titanium film, an aluminum film, and a titanium film is formed, and this metal film is processed in photolithography and etching steps to form the reflective electrode 331. Alternatively, the reflective electrode 331 may be formed using a stack of a silver film and an indium tin oxide film to which silicon oxide is added. The surface shape of the reflective electrode 331 reflects the surface shape of the insulating layer 353; thus, the plurality of depressions 361 are formed in the surface of the reflective electrode 331.

A light-transmitting conductive layer 334 is formed over the reflective electrode 331 (FIG. 4). Here, a semi-transmissive electrode is provided as the cathode of ED1 to form a micro-cavity structure. The light-transmitting conductive layer 334 functions as an adjustment layer that adjusts the optical path length between the reflective electrode 331 and a semi-transmissive layer 332. The thickness of the light-transmitting conductive layer 334 is adjusted in accordance with color of light extracted from the pixel. Here, the unit pixel PIX includes the three pixels of red, green, and blue (RGB) (PixR, PixG, and PixB); therefore, the thickness of the light-transmitting conductive layer 334 is adjusted in accordance with the wavelength range of light of RGB. The surface of the light-transmitting conductive layer 334 is uneven like that of the reflective electrode 331.

The insulating layer 354 including an opening 420 is formed using a photosensitive resin material so as to cover the reflective electrode 331 and the light-transmitting conductive layer 334. The opening 420 and the region 360 of the reflective electrode 331 in which the depressions 361 are formed overlap each other (FIG. 4 and FIG. 7B).

Figure 8B:
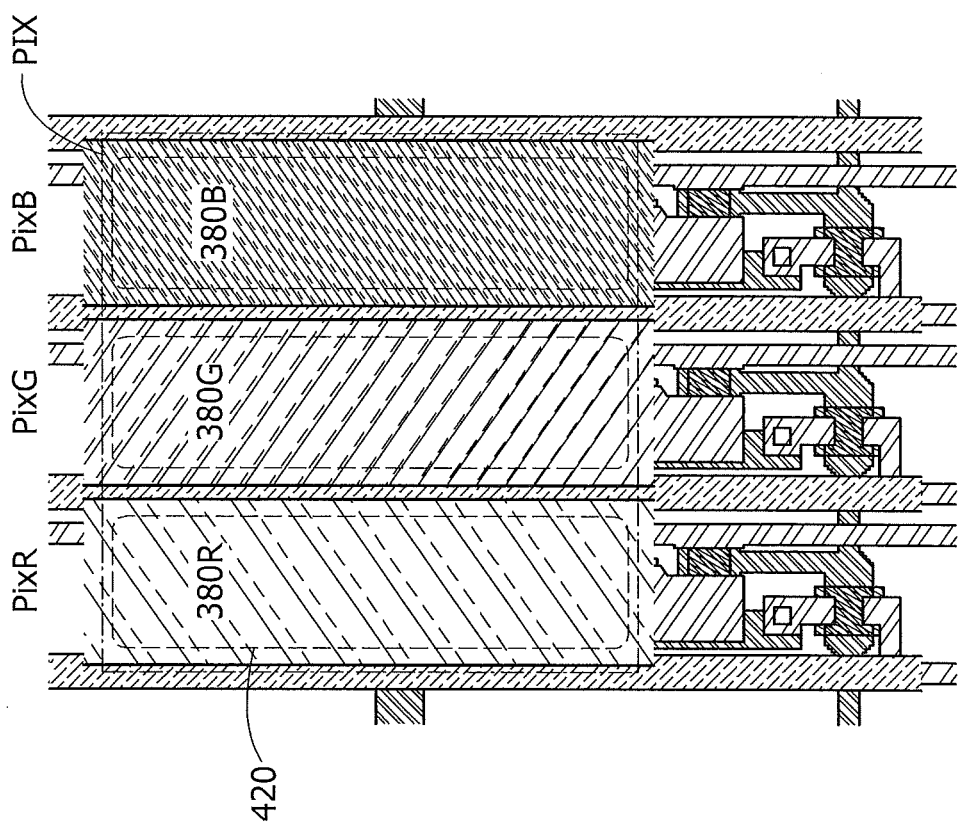
FIGS. 8A and 8B are plan views illustrating an example of a fabricating method of the pixel circuit.
Figure 8A:
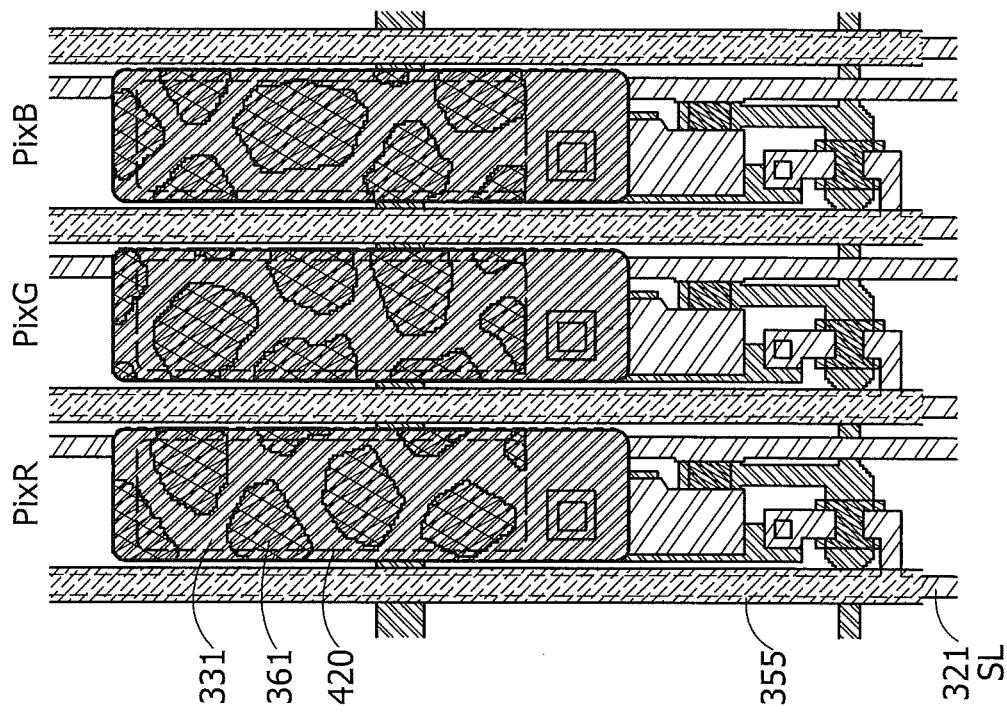

The insulating layer 355 serving as a spacer is formed over the insulating layer 354 (FIG. 4 and FIG. 8A). The insulating layer 355 is formed using a photosensitive resin material. Here, the insulating layer 355 is formed in a region that overlaps the SL 321, as illustrated in FIG. 8A.

A light-emitting layer 333 and the semi-transmissive conductive layer 332 are formed so as to cover the insulating layer 353 and the insulating layer 354. The semi-transmissive conductive layer 332 is shared by all the pixel circuits 230 and functions as the cathode of ED1. A portion where the reflective electrode 331, the light-transmitting conductive layer 334, the light-emitting layer 333, and the semi-transmissive conductive layer 332 are stacked in the opening 420 functions as ED1.

The circuit board 201 is completed through the above steps.

<<CF substrate>>

The CF substrate 202 can be formed in a manner similar to that of the CF substrate 102. A light-blocking layer 379 serving as a black matrix is formed over the substrate 402. Then, color filter layers (380R, 380G, and 380B) that serve as a color filter are formed. As illustrated in FIG. 8B, the color filter layers (380R, 380G, and 380B) for RGB are formed in line along the SL 321.

Through the above steps, the CF substrate 202 is completed. The CF substrate 202 is fixed to the circuit board 201 using a sealant. Further, necessary assembling steps such as providing an optical member for the substrate 402 and mounting an FPC on the substrate 402 are performed to complete the EL panel 260.

This embodiment can be implemented in combination with any of the other embodiments as appropriate.

(Embodiment 3)

In this embodiment, a light-emitting device in which irregularity of the surface shape of all the reflective electrodes in the pixel portion that are regarded as one mirror surface is increased and which easily has a larger screen and higher definition will be described. A method for increasing irregularity of a surface shape of a reflective electrode will be described taking the EL panel 260 (FIG. 4) as an example in this embodiment.

As described in Embodiments 1 and 2, one of the methods for forming a plurality of depressions in a surface of a reflective electrode is a method of forming a plurality of depressions in a surface of an insulating layer that is a base layer of the reflective electrode. Thus, to increase irregularity of the surface shape of the insulating layer 351 of the EL panel 260, the plurality of depressions 361 with irregular shapes are randomly formed in the surface of the insulating layer 353 (see FIG. 7A).

However, when the EL panel 260 has a larger screen and is provided with an increased number of pixels, making the shapes of all the depressions formed in the insulating layer 353 becomes a significant burden on design of a photomask pattern for forming the depressions in the insulating layer 353. In view of the above, in this embodiment, a description will be given of a method for designing a photomask for forming the depressions in the insulating layer 353 with the use of an extremely smaller number of layout patterns than unit pixels while increasing irregularity of the surface shape of the reflective electrode.

FIG. 9A is a plan view illustrating an example that is a standard layout pattern of the depressions 361. FIG. 9B is a standard layout pattern 510 for defining a region where the depressions 361 are formed in the unit pixel PIX.

The planar shape of a standard layout pattern 500 illustrated in FIG. 9A is a shape capable of being tiled by translation operation or rotating operation; a square is employed here. The shape of the standard layout pattern 510 in FIG. 9B is also a square.

Hatching patterns 501 in FIG. 9A correspond to the depressions 361. The shape of the pattern 501 does not have rotational symmetry. All the patterns 501 in the standard layout pattern 500 are different from each other. The pattern 501 is preferably drawn freehand to make the shapes of the patterns 501 themselves irregular. The patterns 501 are preferably provided at substantially regular intervals as illustrated in FIG. 9A. The standard layout pattern 510 is designed so that the proportion of the total area of the plurality of patterns 501 in the standard layout pattern 510 is greater than or equal to 40% and less than or equal to 60%.

A hollow pattern 511 in FIG. 9B corresponds to the region 360 where the depressions 361 are formed (FIG. 7A). A standard mask pattern of a photomask for framing the depressions can be obtained from the standard layout patterns 500 and 510. Specifically, a layout pattern obtained by laying the standard layout patterns 500 and 510 so that they overlap each other as illustrated in FIG. 9C is a standard mask pattern for designing a photomask for forming the depressions.

Here, the shape of the standard layout pattern 510, which is a square having four-fold rotational symmetry, is utilized and four standard mask patterns for forming the depressions are formed from one standard layout pattern 500. Specifically, layout patterns are obtained in such a manner that the standard layout pattern 510 is rotated 0°, 90°, 180°, and 270°, and the layout patterns are used to form standard mask patterns for forming the depressions. FIG. 9D illustrates four standard mask patterns (520A, 520B, 520C, and 520D) formed by such a method. Hereinafter, the standard mask patterns 520A, 520B, 520C, and 520D are referred to as a mask pattern A, a mask pattern B, a mask pattern C, and a mask pattern D, respectively.

Although being formed using the same standard layout pattern 500 and designed by rotating the standard layout pattern 510, the mask patterns A to D can be different from each other because the pattern 501 of the depression does not have rotational symmetry. Note that the shapes and arrangement of some of the patterns 501 in the obtained mask patterns A to D may be finely adjusted.

The patterns 501 of the depressions in the mask patterns A to D are preferably arranged at equal densities as illustrated in FIG. 9D. For this reason, the shapes and arrangement of some of the patterns 501 in the mask patterns obtained by the method in FIG. 9C may be finely adjusted.

The proportions of the total area of the patterns 501 of the depressions to the area of the patterns 511 in the mask patterns A to D in each of pixels (e.g. each of PixR, PixG, and PbixB) are as follows.

A (49.6%, 53.1%, 54.2%)
B (50.5%, 56.2%, 52.6%)
C (49.6%, 52.9%, 50.5%)
D (48.7%, 54.4%, 50.4%)

Thus, the proportion of the total area of the patterns 501 to the area of the pattern 511 in each of the plurality of mask patterns A to D is preferably within the range of ±10% from the mean value, more preferably within the range of ±5% from the mean value. Note that the mean value of the example of FIG. 9D is 51.9%.

By translating one or more of the, mask patterns A to D, a mask pattern for forming the depressions 361 can be designed. FIGS. 10A to 10E illustrate design examples of the mask pattern.

Figures 10A, 10B, 10C, 10D, 10E:
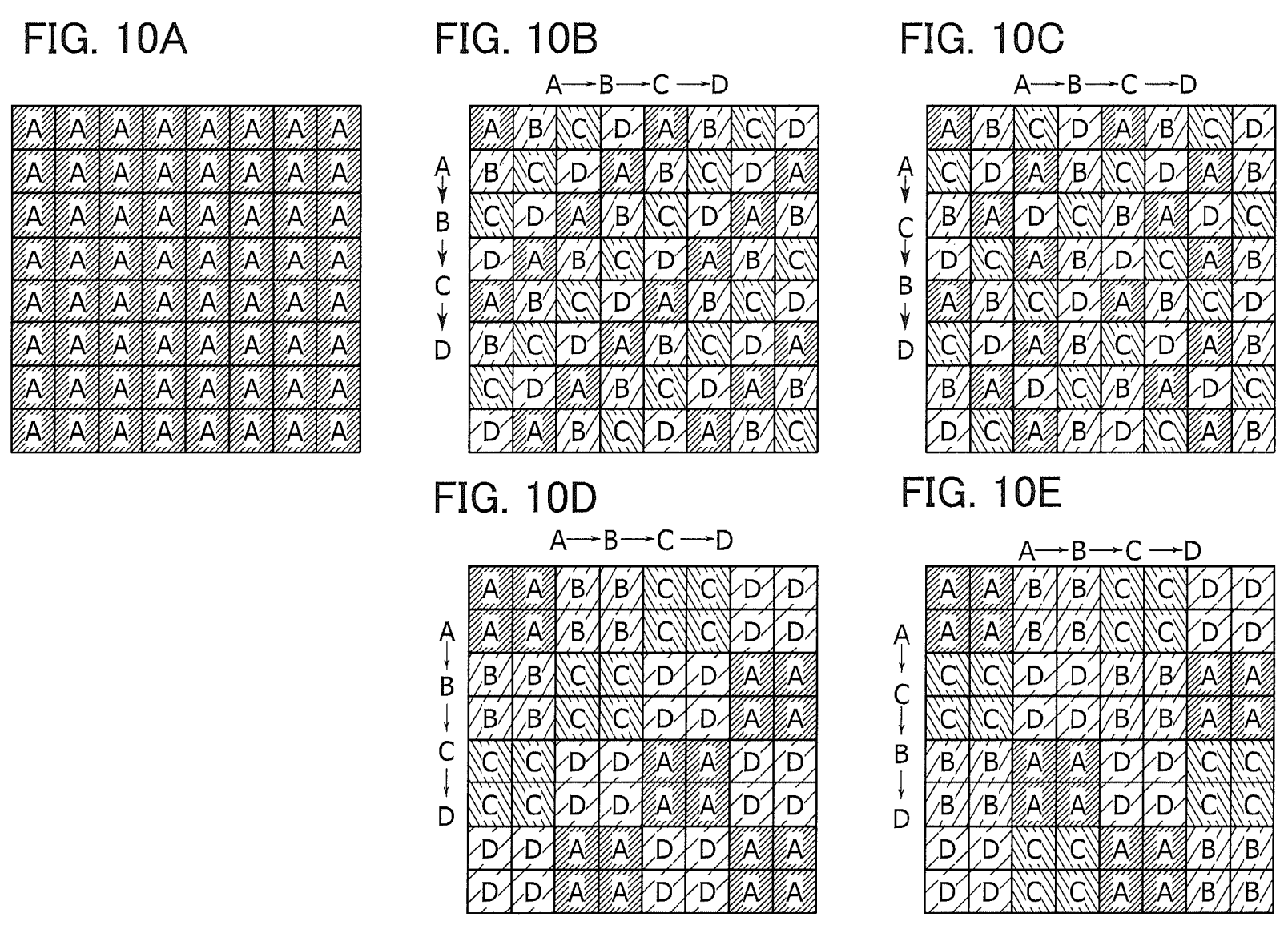

FIG. 10A is a design example where one mask pattern is used; the mask pattern A is used here. FIGS. 10B to 10E are each a design example where the four mask patterns A to D are used.

FIG. 10B is an example where the mask patterns A to D are repeatedly arranged for unit pixels in each row and each column in the order of A, B, C, and D. In FIG. 10C, the mask patterns in the column direction are arranged in the order of A, C, B, and D so that regularity of arrangement of the mask patterns A to D in FIG. 10C is lower than that in FIG. 10B.

In the example in FIG. 10D or 10E, the mask patterns are arranged in such a manner that the same mask patterns are used for two adjacent unit pixels in each row and each column and the mask pattern is changed in the same order as that in FIG. 10B or 10C.

The use of the plurality of mask patterns (FIGS. 10B to 10E) can further increase irregularity of the surface shape of the reflective electrode 331 in a pixel portion. The distribution of the plurality of depressions 361 formed in the insulating layer 353 in the pixel portion corresponds to arrangement of the mask patterns of any of FIGS. 10A to 10E. Specifically, the insulating layer 353 includes, in the pixel portion, a region where one or more kinds of regions having common distribution of the depressions are arranged in array.

In the pixel portion, a plurality of kinds of reflective electrodes having common distribution of the depressions are formed. Thus, the plurality of kinds of reflective electrodes having the same surface shapes are arranged in array in the pixel portion.

Since the mask patterns A to D are formed from the same standard layout pattern 500, the reflecting properties of the reflective electrodes 331 in the adjacent unit pixels PIX are not considerably different from each other even when the depressions 361 are formed in the insulating layer 353 with the use of the plurality of mask patterns A to D. Accordingly, favorable display can be performed on the EL panel 260.

Although the four mask patterns A to D are designed from one standard layout pattern 500, the number of standard mask patterns for forming the depressions can be increased by using the plurality of standard layout patterns 500. For example, the use of two kinds of standard layout patterns 500 enables formation of eight kinds of standard mask patterns for forming the depressions. In the case of using the plurality of standard layout patterns 500, the mask patterns are preferably designed so that the patterns 501 are similarly distributed, in which case a decrease in display quality of the EL panel 260 (e.g., color unevenness) can be precluded.

Although an example where the standard layout pattern 510 is rotated 90° to design the four mask patterns A to D is described here, the angle of rotation is not limited to 90°. For example, when the angle of rotation is 60°, six kinds of standard mask patterns for forming the depressions can be formed from one kind of standard layout pattern 500. Note that the standard layout pattern 500 of the depressions is increased in size in accordance with the angle of rotation of the standard layout pattern 510.

In the case where the standard layout pattern 510 has reflection symmetry, a pattern that can be formed by reflection operation of a standard mask pattern for forming the depressions can be used as a standard mask pattern. Since the standard layout pattern 510 has reflection symmetry as illustrated in FIG. 9B, eight (=4×2) kinds of standard mask patterns for forming the depressions can be formed from one standard layout pattern 500 in the design example of FIG. 9C. That is, patterns that can be formed by reflection operation of the mask patterns A to D can also be used as standard mask patterns.

As described above, according to the method for designing a photomask of this embodiment, irregularity of the surface shapes of a plurality of reflective electrodes in the whole pixel portion can be increased and a larger screen and higher definition can be easily achieved.

This embodiment can be combined with any of the other embodiments in this specification as appropriate.

(Embodiment 4)

In this embodiment, electronic devices each provided with a light-emitting device in a display portion will be described. A lighting device will be described as an example of the light-emitting device.

Examples of the electronic devices to which a display portion including a light-emitting device is applied include television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, and large game machines such as pachinko machines. FIGS. 11A to 11E illustrate specific examples of these electronic devices.

Figure 11A:
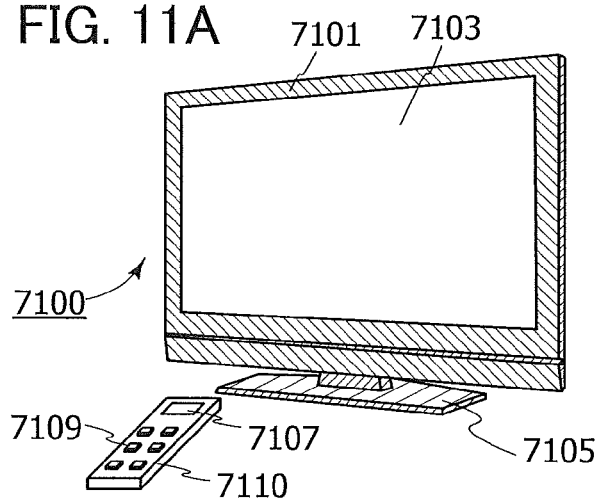
FIGS. 11A to 11E each illustrate an electronic device provided with a display portion including a light-emitting device.

FIG. 11A illustrates an example of a television set. In a television set 7100, a display portion 7103 is incorporated in a housing 7101. The display portion 7103 is capable of displaying images, and a light-emitting device can be used for the display portion 7103. In addition, here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Further, the remote controller 7110 may be provided with a display portion 7107 for displaying data output from the remote controller 7110.

The television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

Figure 11B:
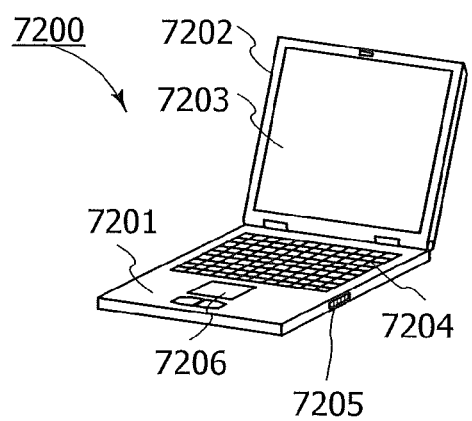

FIG. 11B illustrates an example of a computer. A computer 7200 includes a main body 7201, a housing 7202, a display portion 7203, a keyboard 7204, an external connecting port 7205, a pointing device 7206, and the like.

Figure 11C:
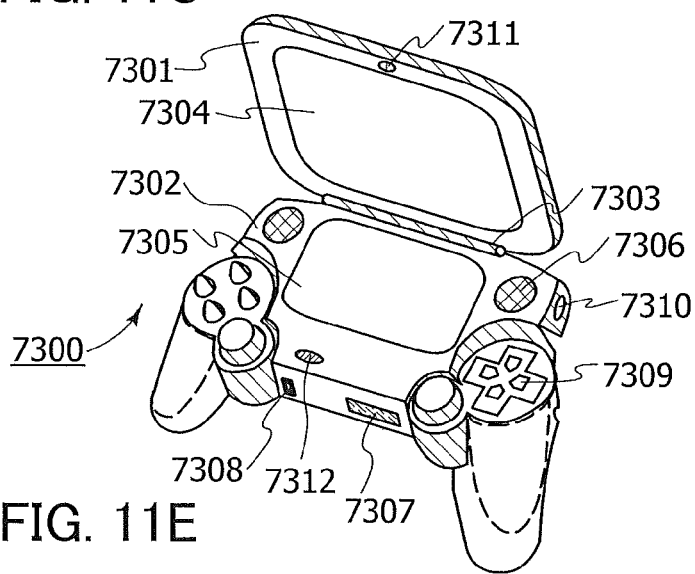

FIG. 11C illustrates an example of a portable game machine. A portable game machine 7300 includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine 7300 includes a speaker portion 7306, a recording medium insertion portion 7307, an LED lamp 7308, input means (operation keys 7309, a connection terminal 7310, a sensor 7311 (a sensor having a function of measuring force, displacement, position, speed, acceleration, angular velocity, rotational speed, distance, light, liquid, magnetism, temperature, chemical substance, sound, time, hardness, electric field, current, voltage, electric power, radiation, flow rate, humidity, gradient, vibration, smell, or infrared ray), a microphone 7312, and the like.

The portable game machine 7300 has a function of reading a program or data stored in a recording medium to display it on the display portion, and a function of sharing data with another portable game machine by wireless communication. Note that a function of the portable game machine 7300 is not limited to the above, and the portable game machine 7300 can have a variety of functions.

It is needless to say that the structure of the portable game machine 7300 is not limited to that in FIG. 11C as long as a light-emitting device is used for at least one or both of the display portion 7304 and the display portion 7305. The portable game machine 7300 can further include any of various accessories as appropriate.

Figure 11D:
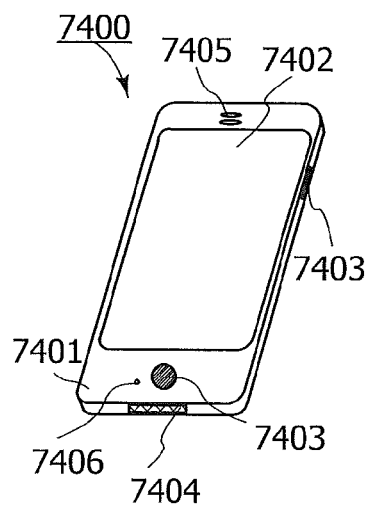

FIG. 11D illustrates an example of a mobile phone. A mobile phone 7400 is provided with operation buttons 7403, an external connection port 7404, a speaker 7405, a microphone 7406, and the like, in addition to a display portion 7402 incorporated in a housing 7401.

When the display portion 7402 of the mobile phone 7400 is touched with a finger or the like, data can be input into the mobile phone 7400. Further, operations such as making a call and creating an e-mail can be performed with the touch of a finger or the like on the display portion 7402.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that characters displayed on a screen can be inputted. In this case, it is preferable to display a keyboard or number buttons on almost the entire screen of the display portion 7402.

When a sensing device including a sensor for sensing inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken with the touch of the palm or the finger on the display portion 7402, whereby personal authentication can be performed. Further, by providing a backlight or a sensing light source which emits a near-infrared light in the display portion, an image of a finger vein, a palm vein, or the like can be taken.

Figure 11E:
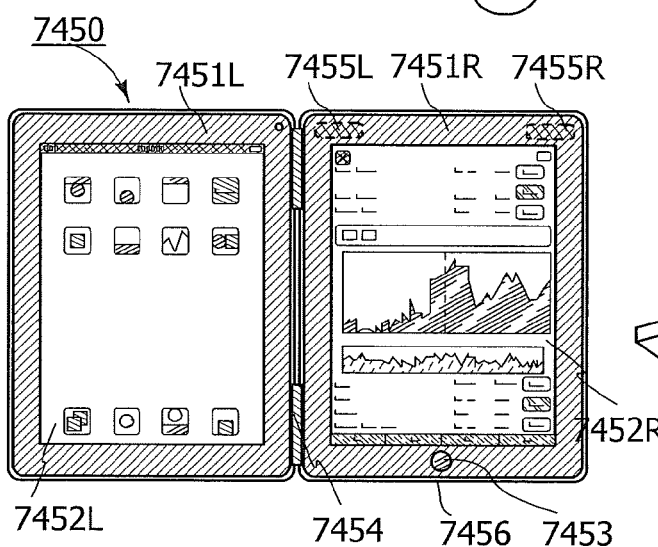

FIG. 11E illustrates an example of a foldable computer. A foldable computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for an installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables data input.

Further, the computer 7450 can also include a gyroscope, an acceleration sensor, a global positioning system (GPS) receiver, a fingerprint sensor, or a video camera. For example, when a detection device including a sensor for sensing inclination, such as a gyroscope or an acceleration sensor, is provided, the orientation of the display screen can be automatically changed by determining the orientation of the computer 7450 (whether the computer 7450 is placed horizontally or vertically for a landscape mode or a portrait mode).

Furthermore, the computer 7450 can be connected to a network. The computer 7450 not only can display data on the Internet but also can be used as a terminal that controls another electronic device connected to the network from a distant place.

Figure 11F:
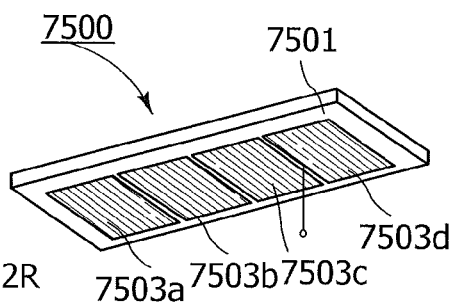
FIG. 11F is an example of a lighting device.

FIG. 11F illustrates an example of a lighting device. In a lighting device 7500, light-emitting devices 7503*a*, 7503*b*, 7503*c*, and 7503*d* of one embodiment of the present invention are incorporated in a housing 7501 as light sources. The lighting device 7500 can be installed on a ceiling, a wall, or the like.

This embodiment can be combined with any of the other embodiments in this specification as appropriate.

This application is based on Japanese Patent Application serial no. 2013-084443 filed with Japan Patent Office on Apr. 15, 2013, the entire contents of which are hereby incorporated by reference.

What is claimed is:

1. A light-emitting device comprising:
    an insulating layer;
    a first electrode over the insulating layer and overlapping with the insulating layer;
    a light-emitting layer over the first electrode; and
    a second electrode overlapping the first electrode with the light-emitting layer between the first electrode and the second electrode,
    wherein the light-emitting layer and the second electrode each overlap a region of the first electrode, a surface of the region being provided with a plurality of depressions formed in response to variations in thickness of the insulating layer, independently of a topography underneath the insulating layer, and
    wherein planar shapes of the plurality of depressions are different from each other and do not have rotational symmetry.

2. The light-emitting device according to claim 1, wherein a depth of the depressions is greater than or equal to 0.2 μm and less than or equal to 1.5 μm.

3. The light-emitting device according to claim 1,
wherein a tilt angle of the depressions is greater than or equal to 2° and less than or equal to 15°.

4. The light-emitting device according to claim 1,
wherein a diameter of a circumcircle of the planar shape of the depressions is greater than or equal to 5 µm and less than or equal to 30 µm.

5. A light-emitting device comprising:
an insulating layer; and
a light-emitting element over the insulating layer,
wherein the light-emitting element comprises:
  a first conductive layer over a portion of the insulating layer and overlapping with the portion of the insulating layer;
  a light-emitting layer over the first conductive layer; and
  a second conductive layer overlapping the first conductive layer with the light-emitting layer between the first conductive layer and the second conductive layer,
wherein a bottom surface of the portion of the insulating layer is flat,
wherein a top surface of the portion of the insulating layer is provided with a plurality of depressions, the top surface facing the bottom surface, and
wherein planar shapes of the plurality of depressions are different from each other and do not have rotational symmetry.

6. The light-emitting device according to claim 5,
wherein a depth of the depressions is greater than or equal to 0.2 µm and less than or equal to 1.5 µm.

7. The light-emitting device according to claim 5,
wherein a tilt angle of the depressions is greater than or equal to 2° and less than or equal to 15°.

8. The light-emitting device according to claim 5,
wherein a diameter of a circumcircle of the planar shape of the depressions is greater than 10 um and less than 30 µm.

9. The light-emitting device according to claim 5,
wherein the insulating layer includes a region where one or more kinds of regions having common distribution of the plurality of depressions are arranged in array.

10. The light-emitting device according to claim 5,
wherein the light-emitting device comprises a pixel portion in which the light-emitting element is one of light-emitting elements having a same structure arranged in an array.

11. A light-emitting device comprising:
an insulating layer;
a first electrode over a portion of the insulating layer and overlapping with the portion of the insulating layer;
a light-emitting layer over the first electrode; and
a second electrode overlapping the first electrode with the light-emitting layer between the first electrode and the second electrode,
wherein a bottom surface of the portion of the insulating layer is flat,
wherein a top surface of the portion of the insulating layer is provided with a plurality of depressions, the top surface facing the bottom surface, and
wherein planar shapes of the plurality of depressions are different from each other and do not have rotational symmetry.

12. The light-emitting device according to claim 11,
wherein a depth of the depressions is greater than or equal to 0.2 µm and less than or equal to 1.5 µm.

13. The light-emitting device according to claim 11,
wherein a tilt angle of the depressions is greater than or equal to 2° and less than or equal to 15°.

14. The light-emitting device according to claim 11,
wherein a diameter of a circumcircle of the planar shape of the depressions is greater than or equal to 5 µm and less than or equal to 30 µm.

15. The light-emitting device according to claim 11,
wherein the insulating layer includes a region where one or more kinds of regions having common distribution of the plurality of depressions are arranged in array.

16. A light-emitting device comprising:
pixel circuits in a pixel portion;
a first insulating layer;
a first electrode and a second electrode, each over the first insulating layer and overlapping with the first insulating layer, and comprised in a first one and a second one of the pixel circuits, respectively;
a second insulating layer over the first insulating layer, between the first electrode and the second electrode, and covering a side portion of the first electrode and a side portion of the second electrode;
a light-emitting layer over the second insulating layer, the first electrode, and the second electrode, and continuously formed from the first electrode to the second electrode; and
a third electrode overlapping the first electrode and the second electrode, with the light-emitting layer between the third electrode and each of the first electrode and the second electrode,
wherein the light-emitting layer and the third electrode each overlap a region of the first electrode, a surface of the region being provided with a plurality of depressions formed in response to variations in thickness of the first insulating layer, independently of a topography underneath the first insulating layer.

17. The light-emitting device according to claim 16,
wherein a tilt angle of the depressions is greater than or equal to 2° and less than or equal to 15°.

18. The light-emitting device according to claim 16,
wherein a diameter of a circumcircle of planar shaped defined by the depressions is greater than or equal to 5 µm and less than or equal to 30 µm.

19. A light-emitting device comprising:
pixel circuits in a pixel portion;
a first insulating layer;
a second insulating layer over the first insulating layer;
a light-emitting layer over the first insulating layer;
a third conductive layer over the light-emitting layer; and
a first light-emitting element and a second light-emitting element over the first insulating layer,
wherein the first light-emitting element comprises:
  a first conductive layer over a first portion of the first insulating layer and overlapping with the first portion of the first insulating layer;
  the light-emitting layer over the first conductive layer and the overlapping with the first portion of the first insulating layer; and
  the third conductive layer overlapping the first conductive layer with the light-emitting layer between the first conductive layer and the third conductive layer,
wherein the second light-emitting element comprises:
  a second conductive layer over a second portion of the first insulating layer and overlapping with the second portion of the first insulating layer;

the light-emitting layer over the second conductive layer and overlapping with the second portion of the first insulating layer; and the third conductive layer overlapping the first conductive layer with the light-emitting layer between the second conductive layer and the third conductive layer, wherein the second insulating layer is between the first conductive layer and the second conductive layer, and covers a side portion of the first conductive layer and a side portion of the second conductive layer, wherein the light-emitting layer is over the second insulating layer, the first conductive layer, and the second conductive layer, and its continuously formed from the first conductive layer to the second conductive layer, wherein bottom surfaces of the first portion and of the second portion of the first insulating layer are flat, and wherein top surfaces of the first portion and of the second portion of the first insulating layer are provided with a plurality of depressions.

20. The light-emitting device according to claim 19, wherein a tilt angle of the depressions is greater than or equal to 2° and less than or equal to 15°.

21. The light-emitting device according to claim 19, wherein a diameter of a circumcircle of planar shapes defined by the depressions is greater than or equal to 5 μm and less than or equal to 30 μm.

* * * * *